US012784824B2

(12) United States Patent
Fratin et al.

(10) Patent No.: US 12,784,824 B2
(45) Date of Patent: *Nov. 3, 2026

(54) SELF-SELECTING MEMORY ARRAY WITH HORIZONTAL ACCESS LINES

(71) Applicant: Micron Technology, Inc., Boise, ID (US)

(72) Inventors: Lorenzo Fratin, Buccinasco (IT); Fabio Pellizzer, Boise, ID (US); Agostino Pirovano, Milan (IT); Russell L. Meyer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 80 days.

This patent is subject to a terminal disclaimer.

(21) Appl. No.: 18/814,164

(22) Filed: Aug. 23, 2024

(65) Prior Publication Data

US 2025/0061943 A1 Feb. 20, 2025

Related U.S. Application Data

(63) Continuation of application No. 17/864,015, filed on Jul. 13, 2022, now Pat. No. 12,100,447, which is a
(Continued)

(51) Int. Cl.
*G11C 13/00* (2006.01)
*H10W 20/43* (2026.01)

(52) U.S. Cl.
CPC ...... *G11C 13/0007* (2013.01); *G11C 13/0026* (2013.01); *H10W 20/43* (2026.01); *G11C 2213/71* (2013.01)

(58) Field of Classification Search
CPC ............ G11C 13/0007; G11C 13/0026; G11C 2213/71; H01L 23/528
See application file for complete search history.

(56) References Cited

U.S. PATENT DOCUMENTS 8,299,571 B2 10/2012 Ozawa et al.
8,729,523 B2 5/2014 Pio
(Continued)

FOREIGN PATENT DOCUMENTS

CN 101345251 A 1/2009
CN 102859690 A 1/2013
(Continued)

OTHER PUBLICATIONS

Chinese Patent Office, "Office Action," issued in connection with Chinese Patent Application No. 20.1980019827 .8, dated May 25, 2021 (8 pages).
(Continued)

*Primary Examiner* — Mohammed A Bashar
(74) *Attorney, Agent, or Firm* — Holland & Hart LLP

(57) ABSTRACT

Methods, systems, and devices for self-selecting memory with horizontal access lines are described. A memory array may include first and second access lines extending in different directions. For example, a first access line may extend in a first direction, and a second access line may extend in a second direction. At each intersection, a plurality of memory cells may exist, and each plurality of memory cells may be in contact with a self-selecting material. Further, a dielectric material may be positioned between a first plurality of memory cells and a second plurality of memory cells in at least one direction. each cell group (e.g., a first and second plurality of memory cells) may be in contact with one of the first access lines and second access lines, respectively.

20 Claims, 16 Drawing Sheets

Related U.S. Application Data continuation of application No. 16/781,958, filed on Feb. 4, 2020, now Pat. No. 11,404,117, which is a continuation of application No. 15/925,536, filed on Mar. 19, 2018, now Pat. No. 10,593,399.

(56) References Cited

U.S. PATENT DOCUMENTS

| | | | |
|---|---|---|---|
| 9,613,689 B1 | 4/2017 | Takaki | |
| 9,978,810 B2 | 5/2018 | Pellizzer | |
| 10,096,655 B1 | 10/2018 | Pellizzer et al. | |
| 2009/0014706 A1 | 1/2009 | Lung | |
| 2009/0294751 A1* | 12/2009 | Kiyotoshi .............. | H10B 63/20 257/4 |
| 2010/0054018 A1* | 3/2010 | Kajigaya ............ | G11C 13/0069 365/174 |
| 2011/0068313 A1 | 3/2011 | Liu | |
| 2011/0305058 A1 | 12/2011 | Park et al. | |
| 2012/0025386 A1 | 2/2012 | Murata | |
| 2012/0140542 A1 | 6/2012 | Liu | |
| 2012/0147649 A1 | 6/2012 | Samachisa et al. | |
| 2012/0319072 A1 | 12/2012 | Wei et al. | |
| 2013/0153998 A1 | 6/2013 | Song et al. | |
| 2013/0187120 A1 | 7/2013 | Redaelli et al. | |
| 2013/0229846 A1 | 9/2013 | Chien et al. | |
| 2014/0217349 A1 | 8/2014 | Hopkins | |
| 2014/0248763 A1 | 9/2014 | Konevecki et al. | |
| 2015/0001460 A1 | 1/2015 | Kim et al. | |
| 2015/0137210 A1 | 5/2015 | Nam et al. | |
| 2016/0104721 A1 | 4/2016 | Seol et al. | |
| 2017/0018598 A1 | 1/2017 | Mouli | |
| 2017/0148851 A1 | 5/2017 | Hsu | |
| 2017/0221813 A1 | 8/2017 | Kim | |
| 2017/0236873 A1 | 8/2017 | Chen et al. | |
| 2018/0026049 A1 | 1/2018 | Lee et al. | |
| 2019/0006423 A1 | 1/2019 | Redaelli | |

FOREIGN PATENT DOCUMENTS

| | | |
|---|---|---|
| CN | 107408570 A | 11/2017 |
| JP | 2013-197254 A | 9/2013 |
| JP | 2014-078714 A | 5/2014 |
| JP | 2015-012296 A | 1/2015 |
| JP | 2015-534720 A | 12/2015 |
| KR | 10-2013-0141585 A | 12/2013 |
| KR | 10-2014-0046971 A | 4/2014 |
| KR | 10-2015-0046149 A | 4/2015 |
| WO | 2017/155784 A1 | 9/2017 |

OTHER PUBLICATIONS

European Patent Office, “Extended Search Report,” issued in connection with European Patent Application No. 19771309.2, dated Sep. 23, 2021 (7 pages).

European Patent Office, “EP Office Action,” issued in connection with European Patent Application No. 19771309.2 dated Apr. 23, 2024 (7 pages).

Hong-Yu, C et al., “Resistive random access memory (RRAM) technology: From material, device, selector, 3D integration to bottom-up fabrication”, Journal of Electroceramics vol. 39, No. 1, Jun. 24, 2017, pp. 21-38. (Abstract).

IMEC; Partner Technical Week: Preliminary 3D Structure Proposals for SCM Application, 2017, 24 pages.

International Search Report and Written Opinion received for PCT Patent Application No. PCT/US19/19126 , mailed on Jun. 12, 2019, 8 pages.

Japan Patent Office, “Notice of Rejection Ground,” issued in connection with Japanese Patent Application No. 2020-549767, dated Nov. 30, 2021 (16 pages).

Japan Patent Office, “Decision to Grant,” issued in connection with Japan Patent Application No. 2020-549767 dated Jan. 31, 2023 (5 pages) (2 pages of English Translation and 3 pages of Original Document).

Korean Patent Office, “Notice of Allowance,” issued in connection with Korean Patent Application No. 10-2020-7028623 dated May 3, 2023 (5 pages) (2 pages of English Translation and 3 pages of Original Document).

Korean Patent Office, “Office Action,” issued in connection with Korean Patent Application No. 10-2020-7028623 dated Oct. 31, 2022 (11 pages) (6 pages of English Translation and 5 pages of Original Document).

Office Action received for Chinese Patent Application No. 201980019827.8, mailed on Feb. 16, 2022, 10 pages (6 pages of English Translation and 4 pages of Original Document).

U.S. Appl. No. 15/482,016, filed Apr. 7, 2017.

Chinese patent office, “China Office Action,” issued in connection with China Patent Application No. 202210904958.8 dated Mar. 25, 2026 (7 pages) (2 pages of English Translation and 5 pages of Original Document).

* cited by examiner

400

700-d 700-e

SELF-SELECTING MEMORY ARRAY WITH HORIZONTAL ACCESS LINES

CROSS REFERENCE

The present application for patent is a continuation of U.S. patent application Ser. No. 17/864,015 by Fratin et al., entitled "SELF-SELECTING MEMORY ARRAY WITH HORIZONTAL ACCESS LINES," filed Jul. 13, 2022, which is a continuation of U.S. patent application Ser. No. 16/781,958 by Fratin et al., entitled "SELF-SELECTING MEMORY ARRAY WITH HORIZONTAL ACCESS LINES," filed Feb. 4, 2020, which is a continuation of and claims priority to and the benefit of U.S. patent application Ser. No. 15/925,536 by Fratin et al., entitled "SELF-SELECTING MEMORY ARRAY WITH HORIZONTAL BIT LINES," filed Mar. 19, 2018, each of which is assigned to the assignee hereof, and each of which is expressly incorporated by reference in its entirety herein.

BACKGROUND

The following relates generally to forming a memory array and more specifically to self-selecting memory array with horizontal access lines.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Access operations may result in a voltage transfer between adjacent selected and unselected memory cells due to bit lines being coupled with multiple word lines. Such a migration may result in reduced reliability relating to subsequent reading of the memory cell, and in some instances may result in data loss.

DETAILED DESCRIPTION

Figure 1:
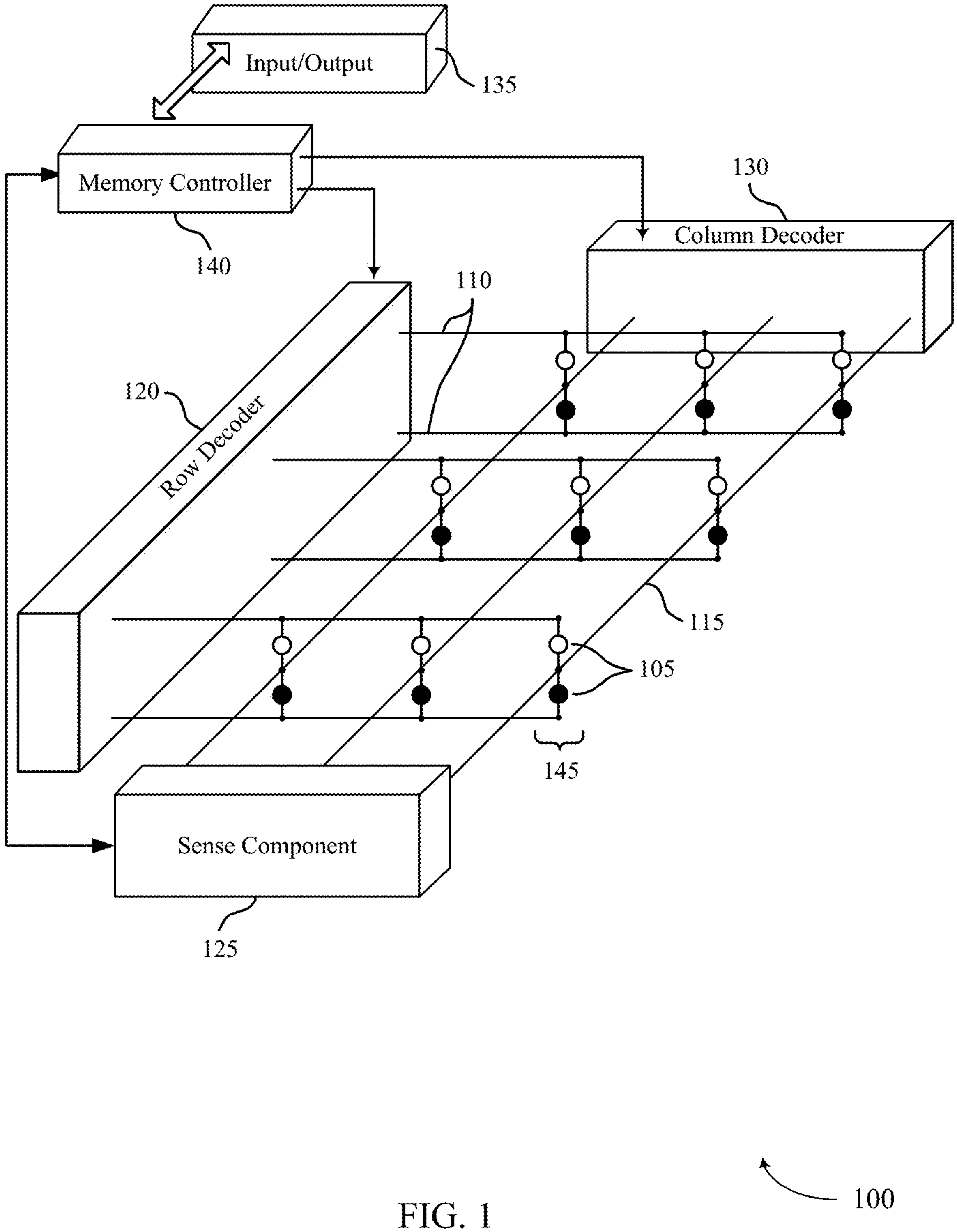
FIG. 1 illustrates an example of a memory array that supports self-selecting memory with horizontal access lines in accordance with examples of the present disclosure.

Selected and unselected memory cells may be susceptible to a voltage transfer between the cell groups. Accordingly, access operations may cause the unwanted voltage transfer, which may result in reduced reliability when reading the stored logic state of the memory cell. In some examples, the voltage transfer may result complete or partial data loss of one or more memory cells. Thus, an architecture that prevents, or minimizes, a voltage transfer between adjacent selected and unselected cells may allow for increased reliability during an access operation (e.g., a read operation), and may prevent data loss of the memory cell.

In a first example, a memory array may include a plurality of first and second access lines extending in different directions. The access lines may intersect, resulting in a three-dimensional memory array that includes a plurality of memory cells. The memory cells may be located at (e.g., directly at, next to) each intersection (e.g., at an intersection of a first access line and a second access line), and may each include a self-selecting material in some cases. For example, a first memory cell may exist at or next to the intersection of a first access line of the first plurality of access lines and a first access line of the second plurality of access lines. And a second memory cell may exist at the intersection of the first access line and a second access line of the second plurality of access lines. As described above, each of the memory cells may include a self-selecting memory. Stated alternatively, the self-selecting memory of each memory cell may be in contact with each access line at the intersection of the lines (e.g., an intersection of a first access line and a second access line), and may possess certain resistive properties that affect access operations (e.g., reading from and writing to) relating to each memory cell.

In some examples, a dielectric material may separate at least a first memory cell of a first plurality of memory cells and a second memory cell of a second plurality of memory cells in at least one direction (e.g., a horizontal direction). By including a dielectric material between the memory cells, each memory cell may be in contact with one first access line and one second access line. Stated alternatively, exactly one memory cell may be selected by activating a single word line (e.g., a second access line) and a single digit line (e.g., first access line). Accordingly, the presence of the dielectric material may isolate different memory cells (e.g., included as part of different pluralities of memory cells) that would otherwise be in communication via a shared access line.

In other examples, a memory array may be formed. The memory array may be formed by first forming a three-dimensional stack of materials, which may include a first, second, and third dielectric material. The dielectric materials may be formed (e.g., layered) such that the first dielectric material is located on a first side (e.g., the top) of the stack and the third dielectric material is located on a second side (e.g., the bottom) of the stack. A first material removal process may then occur, resulting in a plurality of lines etched through at least the first and second dielectric materials in a first direction (e.g., in an "Y" direction). Subsequently, a second material removal process may occur, resulting in plurality of lines etched through the first dielectric material in a second direction (e.g., a "Z" direction that goes in and out of the depicted page, such as FIG. 7C). This may result in orthogonal lines (e.g., channels) etched in to the stack.

In some examples, access lines (e.g., first access lines and second access lines as described above) may be formed within the orthogonal lines. For example, a first plurality of access lines may be formed that are in contact with remaining portions of the first dielectric material. A self-selecting material may be deposited, after the formation of the first plurality of access lines, to form a plurality of memory cells. Subsequently, a plurality of second access lines may be formed that are in contact with the self-selecting memory. Similar to the architecture described above, forming a memory array in such a manner may result in one memory cell located at the intersection of a single word line (e.g., a second access line) and a single digit line (e.g., a first access line). Accordingly, the presence of the dielectric material may isolate other, distinct memory cells (e.g., included as part of different groups or pluralities of memory cells) that would otherwise be in communication via a shared access line.

Further features of the disclosure broadly introduced above are described below in the context of memory arrays that support self-selecting memory with horizontal access lines. These and other features of the disclosure are further-illustrated by and described with reference to apparatus diagrams, system diagrams, method-of-formation diagrams, and flowcharts that relate to self-selecting memory with horizontal access lines.

FIG. 1 illustrates an example memory array 100 that supports self-selecting memory with horizontal access lines in accordance with examples of the present disclosure. Memory array 100 may also be referred to as a memory device, or an electronic memory apparatus. Memory array 100 includes memory cells 105 that are programmable to store different states. In some examples, the memory cells 105 may be self-selecting memory cells. Each memory cell 105 may be programmable to store two states, denoted as a logic 0 and a logic 1. In some cases, memory cell 105 may be configured to store more than two logic states.

A memory cell 105 may include a material, which may be referred to as a memory element, memory storage element, or a self-selecting memory storage element that has a variable and configurable electrical resistance (e.g., a variable and configurable threshold voltage) that is representative of the logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, different internal states may be associated with a threshold voltage that is, current flows after the threshold voltage is exceed. For example, self-selecting memory may enhance differences in a threshold voltage of the memory cell between different programmed states. Thus, if the applied voltage is less than the threshold voltage, no current may flow if the memory element is in the amorphous (e.g., reset) state; if the memory element is in the crystalline (e.g., set) state, it may have a different threshold voltage and, thus, a current may flow in response to the applied voltage. In some examples, the memory element in the set state (e.g., having a low threshold voltage) may not be in a crystalline state, but rather may be in an amorphous state.

To program a memory cell 105 with a self-selecting memory element, programming pulses of different polarities may be applied to the memory cell 105. For example, to program a logic "1" state, a first polarity may be applied and to program a logic "0" state, a second polarity may be applied. The first polarity and the second polarity may be opposite polarities. To read a memory cell 105 with a self-selecting memory storage element, a voltage may be applied across memory cell 105 and the resulting current or the threshold voltage at which current begins to flow may be representative of a logic "1" or a logic "0" state. The crowding of charges, ions, and/or elements at one or another end of the memory storage element may affect the conduction properties and thus the threshold voltage. In some examples, a threshold voltage of a cell may depend on a polarity used to program the cell. For example, a self-selecting memory cell programmed with one polarity may have certain resistive properties and thus one threshold voltage. And that self-selecting memory cell may be programmed with a different polarity that may result in different resistive properties of the cell and thus a different threshold voltage. Thus, when a self-selecting memory cell is programmed, elements within the cell may separate, causing ion migration. Ions may migrate towards a particular electrode, depending on the given cell's polarity. For example, in a self-selecting memory cell, some ions may migrate towards the negative electrode. The memory cell may then be read by applying a voltage across the cell to sense which electrode ions have migrated towards.

In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a three-dimensional (3D) memory array, where two-dimensional (2D) memory arrays are formed on top of one another. This may increase the number of memory cells that may be formed on a single die or substrate as compared with 2D arrays, which in turn may reduce production costs or increase the performance of the memory array, or both. According to the example depicted in FIG. 1, the memory array 100 may include two decks of memory cells 105 and may thus be considered a three-dimensional memory array; however, the number of decks is not limited to two. Each deck may be aligned or positioned so that memory cells 105 may be approximately aligned with one another across each deck, forming a memory cell stack 145. Alternatively, for example, memory array 100 may include two decks of memory cells 105 in which the pitch of the first deck may be different than the pitch of the second deck. The pitch of the first deck, for example, may be smaller than the pitch of the second deck.

According to the example, of FIG. 1, each row of memory cells 105 may be connected to an access line 110, and each column of memory cells 105 may be connected to a bit line 115. Access lines 110 may also be known as word lines 110, and bit lines 115 may also be known as digit lines 115. Word lines 110, bit lines 115, and digit lines 115 may each be referred to as access lines. References to word lines and bit lines, or their analogues, are interchangeable without loss of understanding or operation. Word lines 110 and bit lines 115 may be substantially perpendicular to one another to create memory array 100. As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. In some cases, (not shown) each array may have its own access lines; e.g., each array may have word lines and digit lines that are not in commons with access lines coupled to different arrays. Other configurations may be possible; for example, a third layer may share a word line 110 with a lower layer.

In some examples, each word line 110 may be in communication with a plurality of memory cells 105. For example, a first plurality of memory cells 105 may be in contact with a first access line of a plurality of second access lines 110 (e.g., word lines 110), and a second plurality of memory cells 105 may be in contact with a second access line of a plurality of second access lines 110 (e.g., word lines 110). Each memory cell 105 may be further coupled (e.g., in contact with) a first access line 115 (e.g., a digit line) and separated by a dielectric material. Thus, in some examples, the first plurality of memory cells 105 and the second plurality of memory cells 105 may be positioned between the first access line of the plurality of second access lines 110 (e.g., word line 110) and the second access line of the plurality of second access line 110 (e.g., word line 110). Accordingly, the presence of dielectric material may ensure that each memory cell 105 is in contact with exactly one word line 110 and one bit line 115 such that different memory cells (e.g., of different memory cell groups) may be active and unselected at a same time.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Additionally, read and write operations may be performed on both the first memory deck and second memory deck by activating a word line 110 or a bit line 115. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. Thus, by activating a word line 110 and a bit line 115, a memory cell 105 may be accessed.

Upon accessing, a memory cell 105 may be read, or sensed, by sense component 125 to determine the stored state of the memory cell 105. Additionally, sense component 125 may determine the stored state of a memory cell 105. Sense component 125 may include various transistors or amplifiers in order to detect and amplify a difference in the signals, which may be referred to as latching. The detected logic state of memory cell 105 may then be output through column decoder 130 as input/output 135. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. Additionally, a first memory deck and a second memory deck may be individually written by activating the relevant word line 110 and bit line 115.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or a self-selecting memory accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or self-selecting memory cells may have beneficial properties that may result in improved performance relative to other memory architectures. For example, PCM and/or self-selecting memory may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory array 100. For example, it may apply discharge voltages to a word line 110 or bit line 115 after accessing one or more memory cells 105.

In general, the amplitude, polarity, shape, or duration of an applied voltage or current discussed herein may be adjusted or varied and may be different for the various operations discussed in operating memory array 100. Furthermore, one or multiple memory cells 105 within memory array 100 may be accessed simultaneously; for example, multiple or all cells of memory array 100 may be accessed simultaneously during a reset operation in which all memory cells 105, or a group of memory cells 105, are set to a logic state.

Figure 2A:
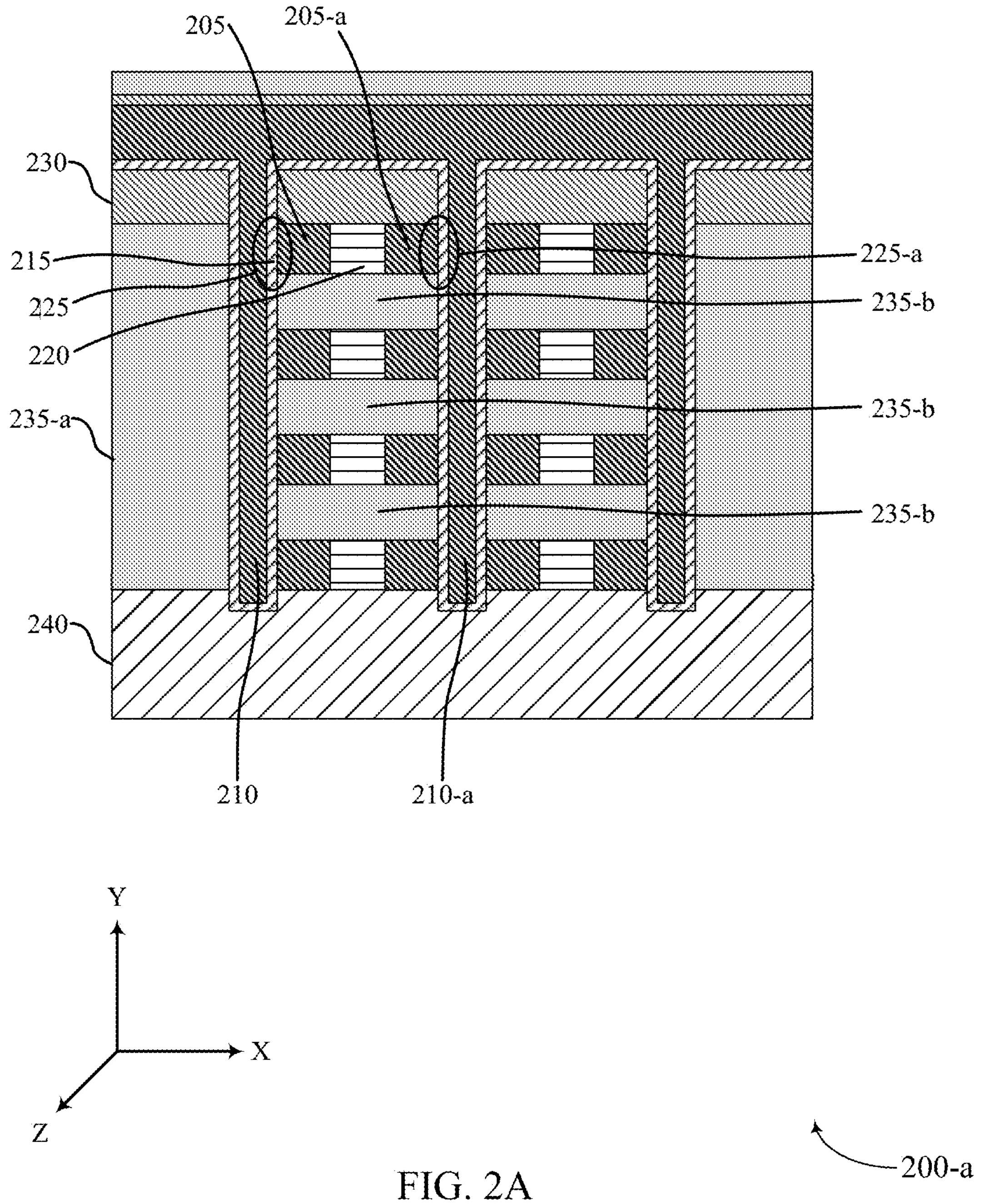
FIGS. 2A and 2B illustrate an example self-selecting memory array that includes horizontal access lines in accordance with examples of the present disclosure

FIG. 2A illustrates an example of a self-selecting memory structure 200-*a* that includes horizontal bit lines in accordance with examples of the present disclosure. The memory structure 200-*a* may include a three-dimensional memory array that includes first access lines extending in a first direction and second access lines extending in a second, different direction. Thus the access lines may form a three-dimensional structure (e.g., a grid) that includes a memory cell at the intersection of access lines (e.g., the intersection of a first access line 205 and a second access line 210). In some examples, each memory cell may include a self-selecting material 215.

Self-selecting memory structure 200-*a* may include first access lines (e.g., first access line 205) and second access lines (e.g., second access line 210). As shown in FIG. 2A, the first access lines may extend in a first (e.g., a horizontal) direction and thus may be referred to as horizontal first access lines. Also shown in FIG. 2A, the second access lines may extend in a second (e.g., a vertical) direction and thus may be referred to as vertical access lines.

The memory structure 200-*a* may also include self-selecting memory 215, which may be or be included in each of the memory cells as described with reference to FIG. 2B. Additionally or alternatively, the memory structure 200-*a* may include first dielectric material 220, second dielectric material 230, third dielectric material (e.g., third dielectric material 235-*a*, third dielectric material 235-*b*), and fourth dielectric material 240. In other examples, memory structure 200-*a* may also include additional access lines, such as first access line 205-*a* and second access line 210-*a*. In other examples, the first access lines may be referred to as bit lines and the second access lines may be referred to as word lines. In further examples, the second dielectric material 230 may be referred to as a protective dielectric material 230, and the fourth dielectric material 240 may be referred to as an insulating dielectric material 240.

In some examples, the memory structure 200-*a* may include a plurality first access lines (e.g., access lines 205 and 205-*a*), and a plurality of second access lines (e.g., access lines 210 and 210-*a*). The first access lines and the second access lines may extend in different directions (e.g., orthogonal directions, other non-parallel directions). For example, as described above, first access line 205 may be referred to as horizontal access lines 205 and may extend in a horizontal direction with reference to the structure shown in FIG. 2A, and the second access lines 210 may be referred to as vertical access lines 210 and may extend in a vertical direction. For example, the first access lines 205 may extend in a “Z” direction, and the second access lines 210 may extend in a “Y” direction. Thus, as depicted in FIG. 2A, the plurality of first access lines may extend in a first direction (e.g., a “Z” direction that goes in and out of the depicted page), and the second plurality of access lines may extend in a second direction (e.g., a “Y” direction) that is different from (e.g., orthogonal to) the first direction. Accordingly, memory structure 200-*a* may be a three-dimensional memory array with a first plurality of access lines and a second plurality of access lines forming a grid-like structure.

For example, access line 210 may be referred to as a first vertical access line 210 (e.g., of a plurality of vertical access lines). The first vertical access line 210 may include a first side and a second side opposite the first side. Additionally or alternatively, second access line 210-*a* may be referred to as a second vertical access line 210-*a*. The second vertical access line 210-*a* may include a first side and a second side opposite the first side. In some examples, the first side of the first vertical access line 210 may be opposite the second side of the second vertical access line 210-*a*.

In other examples, access line 205 may be referred to as a first horizontal access line 205 (e.g., of a plurality of horizontal access lines), and may be coupled with dielectric material (e.g., first dielectric material 220) and a first memory cell 225. Additionally or alternatively, access line 205-*a* may be referred to as a second horizontal access line 205-*a*, and may be coupled with dielectric material (e.g., first dielectric material 220) and a second memory cell 225-*a*. In some examples, the first horizontal access line 205 may be in communication with the first vertical access line 210, and the second horizontal access line 205-*a* may be in communication with the second vertical access line 210-*a*.

The first plurality of access lines (e.g., first access line 205) and the second plurality of access lines (e.g., access line 210) may be in contact with self-selecting memory 215. As described below with reference to FIG. 2B, each of the plurality of memory cells formed within memory structure 200-*a* may include self-selecting memory 215. Thus, the self-selecting memory 215 (e.g., each memory cell) may be located next to the first plurality of access lines and the second plurality of access lines. Stated alternatively, the self-selecting memory 215 may extend in a first direction (e.g., a “Y” direction) and border each of the plurality of second access lines on at least one side. By bordering each of the plurality of access lines, the self-selecting memory 215 may be referred to as being continuous. For example, a first portion of the self-selecting memory 215 may be continuous along a first plurality of memory cells coupled with a first side of a first vertical access line (e.g., second access line 210), and a second portion of the self-selecting memory may be continuous along a second plurality of memory cells coupled with a first side of a second vertical access line (e.g., second access line 210-*a*).

The self-selecting memory 215 may, in some examples, be located at each intersection of the first plurality of access lines and the second plurality of access lines as well as at other locations between these intersections. At least one memory cell (e.g., memory cell 225) may be located at the intersection of first access line 205 and second access line 210. Stated another way, access line 210 may be referred to as a first access line of the plurality of second access lines, and access line 210-*a* may be referred to as a second access line of the plurality of second access lines. A first plurality of memory cells may be in contact with second access line 210 (e.g., a first access line of the plurality of second access lines), and a second plurality of memory cells may be in contact with second access line 210-*a* (e.g., a second access line of the plurality of second access lines). As described below, a first dielectric material 220 may be positioned between the first plurality of memory cells and the second plurality of memory cells.

In some examples, access line 210 may be referred to as a first access line of the plurality of second access lines and access line 210-*a* may be referred to as a second access line of the plurality of second access lines. In some examples, the plurality of second access lines may be shunted in at least one direction. In other examples, access line 205 may be referred to as a first access line of the plurality of first access lines and access line 205-*a* may be referred to as a second access line of the plurality of first access lines. As shown in FIG. 2A, the first access lines 205 and 205-*a* may be separated by a first dielectric material 220. By separating the first access lines 205 and 205-*a* by the dielectric material 220, memory cells located at the intersection of second access line 210 and a first access line 205 (e.g., memory cell 225), and the intersection of second access line 210-*a* and a first access line 205-*a* (e.g., memory cell 225-*a*) may be individually accessed. Stated another way, the presence of dielectric material 220 ensures that access lines 210 may be in communication with access line 205, but not access line 205-*a*. Thus, one memory cell may be activated at a time. But for dielectric material 220, a single access line may extend from second access line 210 to second access line 210-*a*, resulting in multiple memory cells being activated at any one time.

As described above, memory cells (e.g., memory cells 225) may be accessed by activating a relevant word line and bit line. Thus, each of the memory cells may be accessed by activating one of the plurality of first access lines and one of the plurality of second access lines. For example, a memory cell located at the intersection of first access line 205 and second access line 210 (e.g., memory cell 225) may be activated at a same time that a memory cell located at the intersection of first access line 205-*a* and second access line is 210-*a* (e.g., memory cell 225-*a*) is unselected. Alternatively, for example, a memory cell located at the intersection of first access line 205-*a* and second access line 210-*a* (e.g., memory cell 225-*a*) may be activated at a same time that a memory cell located at the intersection of first access line 205 and second access line 210 (e.g., memory cell 225) is unselected. The presence of first dielectric material 220 located between the memory cells may allow for one memory cell (e.g., at the intersection of access line 205 and access line 210) to be accessed at a same time that a second memory cell (e.g., at the intersection of access line 205-*a* and access line 210-*a*) is unselected.

Additionally or alternatively, the presence of self-selecting memory 215 in each memory cell may enhance differences in a threshold voltage of the memory cells between different programmed states. For example, as described above, if the applied voltage is less than the threshold voltage, no current may flow if the memory element is in the reset state; if the memory element is in the set state, it may have a different threshold voltage and, thus, a current may flow in response to the applied voltage. Thus each memory cell may be accessed by applying programming pulses of different polarities to the respective memory cell.

The memory structure 200-*a* may include second dielectric material 230, third dielectric material (e.g., third dielectric material 235-*a*, third dielectric material 235-*b*), and fourth dielectric material 240. In some examples, each of the first, second, and third dielectric materials, respectively, may be a same dielectric material. In other examples, each of the first, second, and third dielectric materials, respectively, may be a same dielectric material. In further examples, any two of the first, second, and third dielectric materials, respectively, may be a same dielectric material. In some examples, third dielectric material (e.g., third dielectric material 235-*a*, third dielectric material 235-*b*) may include multiple portions that may or may not have different characteristics. For example, a third dielectric material may include a first portion (e.g., third dielectric material 235-*a* in contact with second dielectric material 230 and fourth dielectric material 240) and a second portion (e.g., third dielectric material 235-*b* in contact with first access lines 205 and 205-*a*). In some examples, the third dielectric material 235-*a* and third dielectric material 235-*b* may be formed at different times. For example, third dielectric material 235-*b* may be formed before third dielectric material 235-*a*. In other examples, third dielectric material 235-*b* may be formed after third dielectric material 235-*a*. As discussed above, the first dielectric material 220 may separate two access lines, (e.g., access lines 205 and 205-*a*) to ensure that memory cells may be individually-selected. The second, third, and fourth dielectric materials may isolate (e.g., electrically isolate) or protect various portions and/or components of the memory array 200.

As an example, first dielectric material 220 and third dielectric material 235-*b* may electrically isolate each of first access lines. For example, first dielectric material 220 may isolate first access line 205 from first access line 205-*a* in one direction (e.g., an "X" direction). Third dielectric material 235-*b* may isolate second access line 210 from second access line 210-*a* in a same direction (e.g., an "X" direction). In other examples, third dielectric material 235-*b* may isolate one or more of first access lines 205 and 205-*a* from an additional first access line (not shown) in a second direction (e.g., a "Y" direction). Thus the combination of first dielectric material 220 and third dielectric material 235-*b* may operate in conjunction to ensure that multiple access lines (e.g., second access line 210 and second access line 210-*a*) are electrically isolated from each other.

Second dielectric material 230 and fourth dielectric material 240 may aid the method of fabricating memory structure 200-*a*. For example, as described below with reference to FIGS. 7A through 7E, a stack may be formed that includes, among other materials, second dielectric material 230 and fourth dielectric material 240. The stack may be etched in order to form the plurality of first access lines. For consistency, it is preferable that each etch be a same dimension in at least one direction (e.g., a "Y" direction). Thus fourth dielectric material 240 may be included in the stack to ensure a consistent etch depth. For example, third dielectric material (e.g., third dielectric material 235-*a*, third dielectric material 235-*b*) and fourth dielectric material 240 may be different materials. Thus, during an etching process, a channel may be etched through the third dielectric material (e.g., in a "Y" direction). However, due to the presence of fourth dielectric material 240, or due to fourth dielectric material 240 being a different material than third dielectric material (e.g., third dielectric material 235-*a*, third dielectric material 235-*b*), the etching process may end upon reaching the fourth dielectric material 240. Accordingly, each of the plurality of second access lines may be formed having a consistent dimension (e.g., in a "Y" direction).

Similarly, second dielectric material 230 may aid in the method of fabricating memory structure 200-*a*, as described below with reference to FIGS. 7A through 7E. As described above, a stack may be formed that includes, among other materials, second dielectric material 230 and third dielectric material (e.g., third dielectric material 235-*a*, third dielectric material 235-*b*), and may be etched in order to form the plurality of second access lines (e.g., second access line 210). In some examples, the etch depth in at least one direction (e.g., a "Y" direction) may be such that the etching process may degrade the openings (e.g., vias or holes) in which the second access lines may be formed. For example, openings having a greater dimension in at least one direction (e.g., a "Y" direction) may be more susceptible to degradation. Accordingly, the presence of second dielectric material 230 may aid the fabrication process such that the etching process results in consistent openings and, ultimately consistent second access lines formed therein.

Figure 2B:
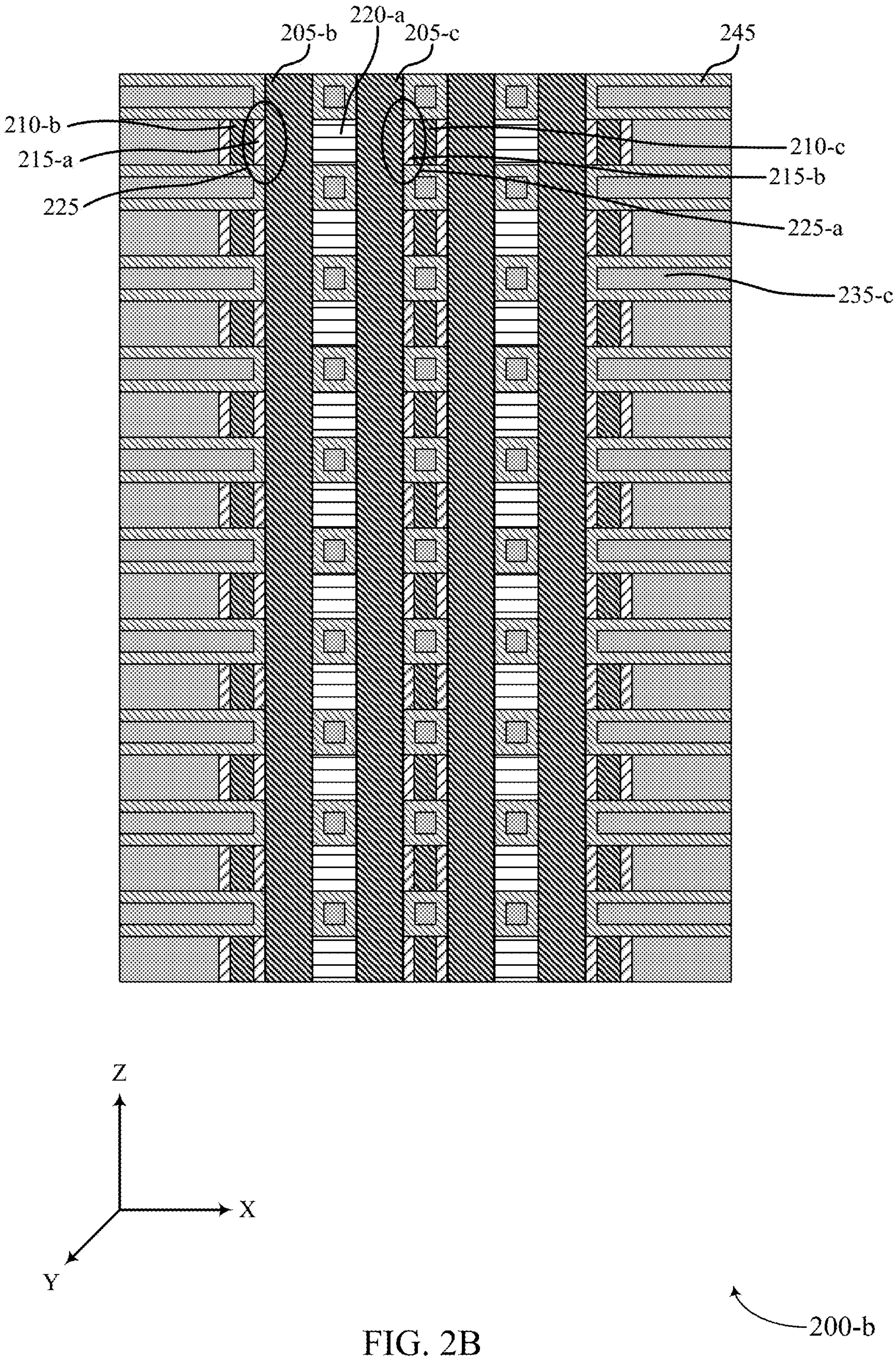

FIG. 2B illustrates an example of a self-selecting memory structure 200-*b* that includes horizontal bit lines in accordance with examples of the present disclosure. The memory structure 200-*b* may be an example of memory structure 200-*a* as described with reference to FIG. 2A, shown from a different perspective. FIG. 2B may include a three-dimensional memory array that includes first access lines (e.g., 205-*b* and 205-*c*) extending in a first direction and second access lines (e.g., 210-*b* and 210-*c*) extending in a second, different direction. Thus the access lines may form a three-dimensional structure (e.g., a grid) that includes a memory cell at the intersection of access lines (e.g., the intersection of a first access line 205-*b* and a second access line 210-*b*). In some examples, each memory cell may include a self-selecting material self-selecting memory 215.

Self-selecting memory structure 200-*b* may include first access lines, and second access lines extending in a different direction. As described above, the first access lines may extend in a first direction and the second access lines may extend in a second direction. The memory structure 200-*b* may also include self-selecting memory 215, which may be included in each of memory cell 225 and memory cell 225-*a*. Additionally or alternatively, the memory structure 200-*b* may include first dielectric material 220-*a*, third dielectric material 235-*c*, a fourth dielectric material 240 (not shown), and a fifth dielectric material 245.

As described above with reference to FIG. 2A, each memory cell may include a self-selecting memory 215. Thus the self-selecting memory 215 (e.g., each memory cell) may be located next or may be in contact with a first access line (e.g., first access line 205-*b*) and a second access line (e.g., second access line 210-*b*). Stated alternatively, the self-selecting memory 215 may extend in a first direction and border each of the plurality of second access lines on at least one side, as depicted in FIG. 2A.

In some examples, memory cell 225 may be referred to as a first memory cell 225 and may be coupled with the first side of the first vertical access line 210, as described with reference to FIG. 2A. In other examples, memory cell 225-*a* may be referred to as a second memory cell 225-*a* and may be coupled with the second side of the second vertical access line 210-*a*, as described with reference to FIG. 2A. Each of the first memory cell 225 and the second memory cell 225-*a* may include a self-selecting memory 215. Additionally or alternatively, a dielectric material (e.g., first dielectric material 220) may be located between with the first memory cell 225 and the second memory cell 225-*a*.

As described above, memory structure 200-*b* may include first access lines 205-*b* and 205-*c*, and second access lines 210-*b* and 210-*c*. As shown in FIG. 2B, each of first access lines 205-*b* and 205-*c* may be separated by first dielectric material 220-*a*. By separating the first access lines 205-*b* and 205-*c* by the dielectric material 220-*a*, memory cell 225 that is located at the intersection of second access line 210-*b* and a first access line 205-*b* may be isolated from memory cell 225-*a* that is located at the intersection of first access line 205-*c* and second access line 210-*c*. Stated another way, the presence of dielectric material 220-*a* ensures that access line 210-*b* may be in communication with access line 205-*b*, but not access line 205-*c*. In such an example, exactly one of memory cell 225 or memory cell 225-*a* may be activated at a time. But for dielectric material 220, a single access line may extend from second access line 210-*b* to second access line 210-*c*, resulting in multiple memory cells being activated at any one time.

As depicted in FIG. 2B, one of memory cell 225 or memory cell 225-*a* may be accessed by activating a relevant word line and bit line. Thus, each of memory cell 225 and memory cell 225-*a* may be accessed by activating a respective first access line and second access line. For example, a memory cell located at the intersection of first access line 205-*b* and second access line 210-*b* may be activated at a same time that a memory cell located at the intersection of first access line 205-*c* and second access line 210-*c* is unselected. Alternatively, for example, a memory cell located at the intersection of first access line 205-*c* and second access line 210-*c* may be activated at a same time that a memory cell located at the intersection of first access line 205-*b* and second access line 210-*b* is unselected. The presence of first dielectric material 220-*a*, located between the memory cells, may allow for memory cell 225 to be accessed at a same time that memory cell 225-*a* is unselected.

Figure 3:
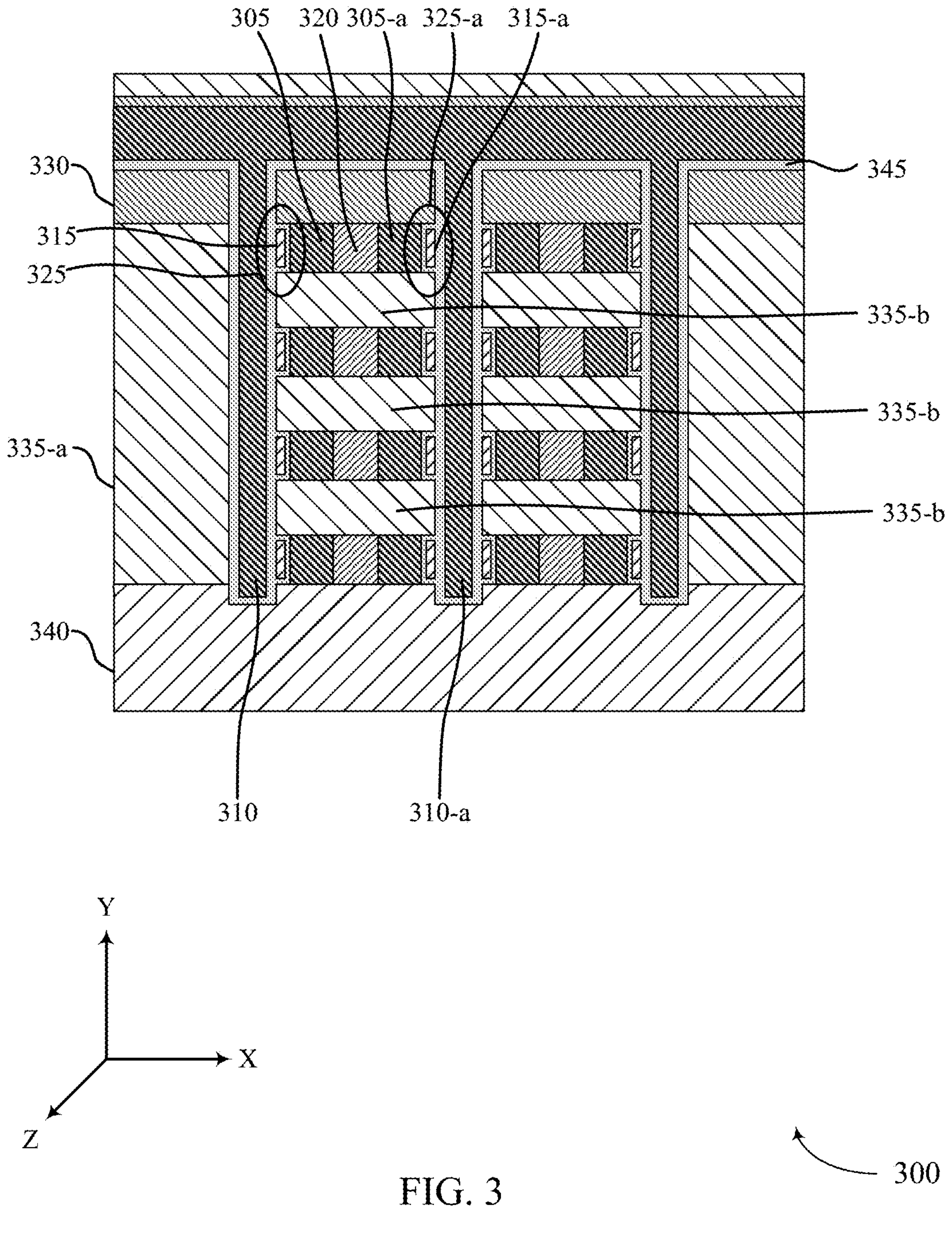
FIGS. 3 through 6 illustrate example self-selecting memory arrays that include horizontal access lines in accordance with examples of the present disclosure.

FIG. 3 illustrates an example of a self-selecting memory structure 300 that includes horizontal bit lines in accordance with examples of the present disclosure. The memory structure 300 may be an example of, or may include features described with respect to memory structures 200-*a* and 200-*b* with reference to FIGS. 2A and 2B, respectively. The memory structure 300 may include a three-dimensional memory array that includes first access lines extending in a first direction and second access lines extending in a second, different direction. The access lines may form a three-dimensional structure (e.g., a grid) that includes a memory cell at the intersection of access lines (e.g., the intersection of a first access line 305 and a second access line 310). In some examples, each memory cell may include a self-selecting material segment 315.

Self-selecting memory structure 300 may include first access lines 305 and 305-*a*, which may be examples of first access lines 205 and 205-*a* as described with reference to FIG. 2A; second access lines 310 and 310-*a*, which may be examples of second access lines 210 and 210-*a* as described with reference to FIG. 2A; and self-selecting material 315 and 315-*a*, which may be an example of self-selecting memory 215 as described with reference to FIG. 2A. The memory structure 300 may also include first dielectric material 320, which may be an example of first dielectric material 220 as described with reference to FIG. 2A; and memory cells 325 and 325-*a*, which may be examples of memory cell 225 and memory cell 225-*a* as described with reference to FIG. 2B.

Memory structure 300 may also include second dielectric material 330, which may be an example of second dielectric material 230 as described with reference to FIG. 2A; third dielectric material (e.g., third dielectric material 335-*a*, third dielectric material 335-*b*), which may be an example of third dielectric material (e.g., third dielectric material 235-*a*, third dielectric material 235-*b*) as described with reference to FIG. 2A; and fourth dielectric material 340, which may be an example of fourth dielectric material 240 as described with reference to FIG. 2A. In some examples, the first access lines may be referred to as word lines and the second access lines may be referred to as bit lines. In other examples, the second dielectric material 330 may be referred to as a protective dielectric material 330, and the fourth dielectric material 340 may be referred to as an insulating dielectric material 340.

In some examples, the memory structure 300 may include a plurality first access lines (e.g., access lines 305 and 305-*a*), and a plurality of second access lines (e.g., access lines 310 and 310-*a*). The first access lines and the second access lines may extend in different directions (e.g., orthogonal directions, other non-parallel directions). For example, as described above, first access line 305 may be referred to as a horizontal access line 305 and may extend in a horizontal direction, and the second access line 310 may be referred to as a vertical access line 310 and may extend in a vertical direction. Thus, as depicted in FIG. 3, the plurality of first access lines may extend in a first direction (e.g., a “Z” direction that goes in and out of the depicted page), and the second plurality of access lines may extend in a second direction (e.g., a “Y” direction) that is different from (e.g., orthogonal to) the first direction. Accordingly, memory structure 300 may be a three-dimensional memory array with a first plurality of access lines and a second plurality of access lines forming a grid-like structure.

The first plurality of access lines and the second plurality of access lines may be in contact with individual self-selecting memory segments. In some examples, the individual self-selecting memory segments may be referred to as a plurality of discrete self-selecting memory segments, and memory structure 300 may contain at least a first subset of discrete self-selecting memory segments and a second subset of discrete self-selecting memory segments. For example self-selecting memory segment 315 may be referred to as a first subset of discrete self-selecting memory, and self-selecting memory segment 315-*a* may be referred to as a second subset of discrete self-selecting memory. Each self-selecting memory segment may be adjacent one access line of the first plurality of access lines and one access line of the second plurality of access lines. Stated alternatively, the self-selecting memory segments may extend in a first (e.g., a “Y”) direction and have a similar dimension (e.g., in the “Y” direction) as a first access line (e.g., first access line 305). Thus at least one self-selecting memory segment may be formed at each intersection of access lines (e.g. an intersection of first access line 305 and second access line 310). Accordingly, a memory cell 325 may be located at the intersection of first access line 305 and a second access line 310, and a memory cell 325-*a* may be located at the intersection of first access line 305-*a* and second access line 310-*a*. In some examples, each self-selecting memory segment 315 may be located within material 345, which may be a dielectric material 345 or a conductive material 345, and may act as a sealing material. Stated another way, material 345 may electrically isolate each self-selecting memory segment 315.

In some examples, memory cell 325 may be referred to as a first memory cell 325 and may be coupled with the first side of the first vertical access line 310 (e.g., as described with reference to FIG. 2A). In other examples, memory cell 325-*a* may be referred to as a second memory cell 325-*a* and may be coupled with the second side of the second vertical access line 310-*a* (e.g., as described with reference to FIG. 2A). Each of the first memory cell 325 and the second memory cell 325-*a* may include a self-selecting memory segment 315. As described above, the memory structure 300 may include a plurality of first discrete self-selecting memory segments 315 and a plurality of second discrete self-selecting memory segments 315-*a*. In some examples, the plurality of first discrete segments 315 including the first self-selecting memory (e.g., as described with reference to FIG. 2A) and the plurality of second discrete self-selecting memory segments 315-*a* may include the second self-selecting memory (e.g., as described with reference to FIG. 2A). In other examples, the first memory cell 325 may include one of the plurality of first discrete self-selecting memory segments 315 and the second memory cell may include one of the plurality of second discrete self-selecting memory segments 315-*a*. Each of the discrete self-selecting memory segments may include chalcogenide. Additionally or alternatively, a dielectric material (e.g., first dielectric material 220) may be located between with the first memory cell 225 and the second memory cell 225-*a*.

As described above, access line 310 may be referred to as a first access line of the plurality of second access lines, and access line 310-*a* may be referred to as a second access line of the plurality of second access lines. In some examples, the plurality of second access lines may be shunted in at least one direction. In other examples, access line 305 may be referred to as a first access line of the plurality of first access lines, and access line 305-*a* may be referred to as a second access line of the plurality of first access lines.

As shown in FIG. 3, the first access lines 305 and 305-*a* may be separated by a first dielectric material 320. By separating the first access lines 305 and 305-*a*, a memory cell may be located at the intersection of second access line 310 and a first access line 305, and at the intersection of second access line 310-*a* and a first access line 305-*a*. The memory cells (e.g., memory cell 325 and 325-*a*) may be individually accessed. Stated another way, the presence of dielectric material 320 ensures that access line 310 may be in communication with access line 305, but not access line 305-*a*. Thus, one memory cell may be activated at a time. In some examples, but for dielectric material 320, a single access line may extend from second access line 310 to second access line 310-*a*, resulting in multiple memory cells being activated at any one time.

In some examples, memory cells (e.g., memory cells 225 as described with reference to FIG. 2B) may be accessed by activating a relevant word line and bit line. Thus, each of the memory cells may be accessed by activating one of the plurality of first access lines and one of the plurality of second access lines. For example, a memory cell located at the intersection of first access line 305 and second access line 310 may be activated at a same time that a memory cell located at the intersection of first access line 305-*a* and second access line 310-*a* is unselected. Alternatively, for example, a memory cell located at the intersection of first access line 305-*a* and second access line 310-*a* may be activated at a same time that a memory cell located at the intersection of first access line 305 and second access line 310 is unselected. The presence of first dielectric material 320 located between the memory cells may allow for memory cell 325 (e.g., at the intersection of access line 305 and access line 310) to be accessed at a same time that a second memory cell 325-*a* (e.g., at the intersection of access line 305-*a* and access line 310-*a*) is unselected.

Additionally or alternatively, the presence of self-selecting memory (e.g., self-selecting memory segments 315 and 315-*a*) in each memory cell may enhance differences in a threshold voltage of the memory cells between different programmed states. For example, as described above, if the applied voltage is less than the threshold voltage, no current may flow if the memory element is in the reset state; if the memory element is in the set state, it may have a different threshold voltage and, thus, a current may flow in response to the applied voltage. Thus each memory cell may be accessed by applying programming pulses of different polarities to the respective memory cell.

Additionally or alternatively, memory structure 300 may include second dielectric material 330, third dielectric material (e.g., third dielectric material 335-*a*, third dielectric material 335-*b*), and fourth dielectric material 340. In further examples, any two of the first, second, and third dielectric materials, respectively, may be a same dielectric material. In some examples, third dielectric material (e.g., third dielectric material 335-*a*, third dielectric material 335-*b*) may include multiple portions that may or may not have different characteristics.

For example, a third dielectric material may include a first portion (e.g., third dielectric material 335-*a* in contact with second dielectric material 330 and fourth dielectric material 340) and a second portion (e.g., third dielectric material 335-*b* in contact with first access lines 305 and 305-*a*). In some examples, the third dielectric material 335-*a* and third dielectric material 335-*b* may be formed at different times. For example, third dielectric material 335-*b* may be formed before third dielectric material 335-*a*. In other examples, third dielectric material 335-*b* may be formed after third dielectric material 335-*a*. As discussed above, the first dielectric material 320 may separate two access lines, (e.g., access lines 305 and 305-*a*) to ensure that memory cells may be individually-selected. The second, third, and fourth dielectric materials may isolate (e.g., electrically isolate) or protect various portions and/or components of the memory array 300.

As an example, first dielectric material 320 and third dielectric material 335-*b* may electrically isolate each of first access lines. For example, first dielectric material 320 may isolate first access line 305 from first access line 305-*a* in one direction (e.g., an "X" direction). Third dielectric material 335-*b* may isolate second access line 310 from second access line 310-*a* in a same direction (e.g., an "X" direction). In other examples, third dielectric material 335-*b* may isolate one or more of first access lines 305 and 305-*a* from an additional first access line (not shown) in a second direction (e.g., a "Y" direction). Thus the combination of first dielectric material 320 and third dielectric material 335-*b* may operate in conjunction to ensure that multiple access lines (e.g., second access line 310 and second access line 310-*a*) are electrically isolated from each other.

Second dielectric material 330 and fourth dielectric material 340 may aid the method of fabricating memory structure 300. For example, as described below with reference to FIGS. 7A through 7E, a stack may be formed that includes, among other materials, second dielectric material 330 and fourth dielectric material 340. The stack may be etched in order to form the plurality of first access lines. For consistency, it is preferable that each etch be a same dimension in at least one direction (e.g., a "Y" direction). Thus fourth dielectric material 340 may be included in the stack to ensure a consistent etch depth. For example, third dielectric material (e.g., third dielectric material 335-*a*, third dielectric material 335-*b*) and fourth dielectric material 340 may be different materials. Thus, during an etching process, at least one channel may be etched in third dielectric material (e.g., in a "Y" direction). However, due to the presence of fourth dielectric material 340, or due to fourth dielectric material 340 being a different material than third dielectric material (e.g., third dielectric material 335-*a*, third dielectric material 335-*b*), the etching process may end upon reaching the fourth dielectric material 340. Accordingly, each of the plurality of second access lines may be formed having a consistent dimension (e.g., in a "Y" direction).

Similarly, second dielectric material 330 may aid in the method of fabricating memory structure 300, as described below with reference to FIGS. 7A through 7E. As described above, a stack may be formed that includes, among other materials, second dielectric material 330 and third dielectric material (e.g., third dielectric material 335-*a*, third dielectric material 335-*b*), and may be etched in order to form the plurality of second access lines (e.g., second access line 310). In some examples, the etch depth in at least one direction (e.g., a "Y" direction) may be such that the etching process may degrade the openings (e.g., vias or holes) in which the second access lines may be formed. For example, openings having a greater dimension in at least one direction (e.g., a "Y" direction) may be more susceptible to degradation. Accordingly, the presence of second dielectric material 330 may aid the fabrication process such that the etching process results in consistent openings and, ultimately consistent second access lines formed therein.

Figure 4:
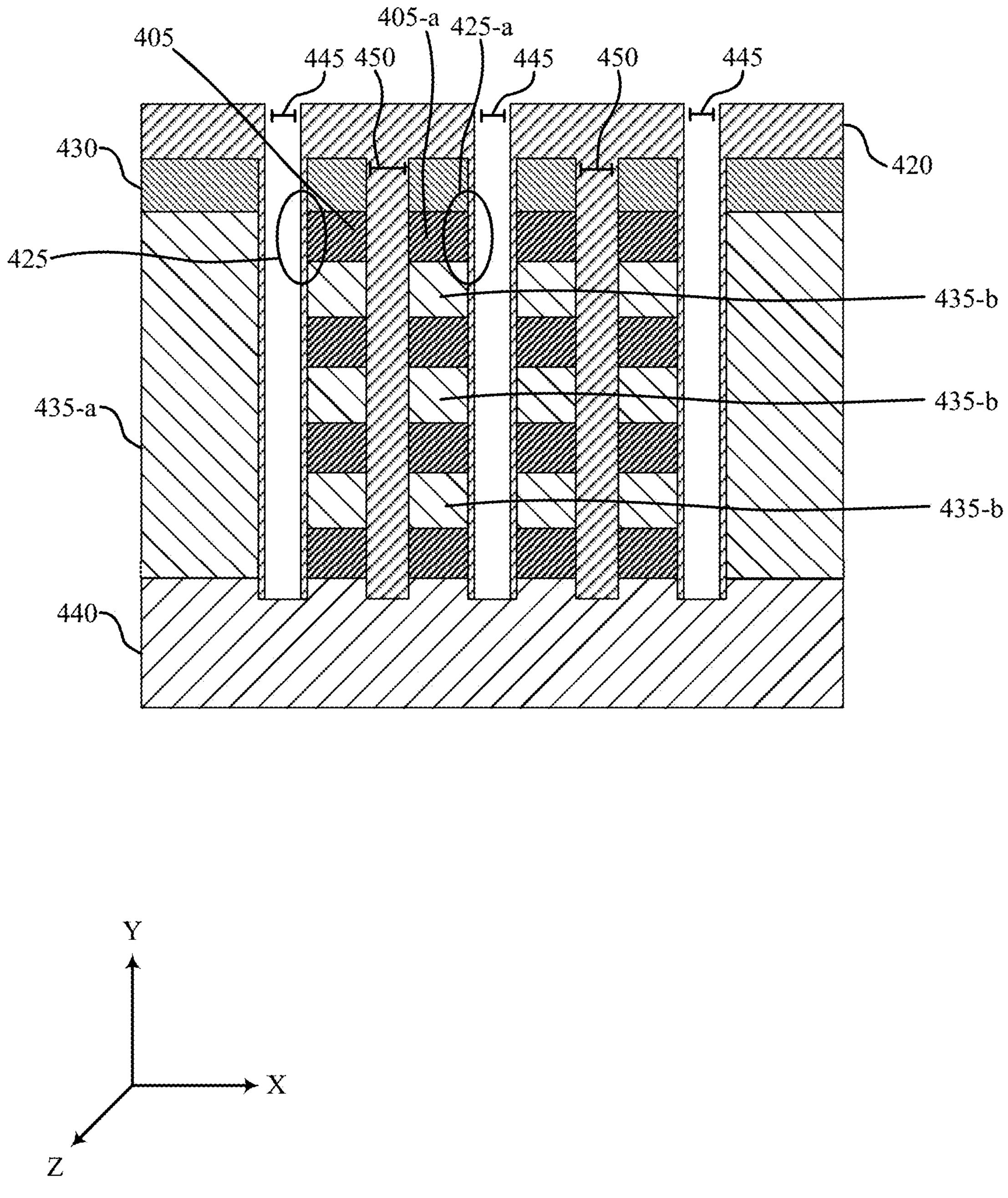

FIG. 4 illustrates an example of a self-selecting memory structure 400 that includes horizontal bit lines in accordance with examples of the present disclosure. The memory structure 400 may be an example of, or may include features described with respect to memory structures 200-*a*, and 200-*b*, and 300 as described with reference to FIGS. 2A, 2B, and 3, respectively. The memory structure 400 may include a three-dimensional memory array that includes first access lines extending in a first direction and second access lines extending in a second, different direction. The access lines may form a three-dimensional structure (e.g., a grid) that includes a memory cell at the intersection of access lines (e.g., the intersection of a first access line 405 and a second access line (not shown)). In some examples, each memory cell may include a self-selecting material (not shown).

Self-selecting memory structure 400 may include first access line 405 and 405-*a*, which may be an example of first access line 205 and 205-*a* as described with reference to FIG. 2A; and memory cell 425 and memory cell 425-*a*, which may be an example of memory cell 225 and memory cell 225-*a*, respectively, as described with reference to FIG. 2B. Memory structure 400 may also include first dielectric material 420, which may be an example of first dielectric material 220 as described with reference to FIG. 2A; second dielectric material 430, which may be an example of second dielectric material 230 as described with reference to FIG. 2A; third dielectric material (e.g., third dielectric material 435-*a*, third dielectric material 435-*b*), which may be an example of third dielectric material (e.g., third dielectric material 235-*a*, third dielectric material 235-*b*) as described with reference to FIG. 2A; and fourth dielectric material

440, which may be an example of fourth dielectric material 240 as described with reference to FIG. 2A.

Memory structure 400 may also include channels 445, which may be examples of the channels in which the second access lines (e.g., access lines 210 as described with reference to FIG. 2A) are formed; and channels 450, which may be examples of the channels in which the first dielectric material 420 is deposited. In some examples, the first access line 405 and 405-*a* may be referred to as bit lines. In other examples, the second dielectric material 430 may be referred to as a protective dielectric material 430, and the fourth dielectric material 440 may be referred to as an insulating dielectric material 440.

In some examples, the memory structure 400 may include a plurality of etched channels 445. The channels 445 may be etched such that a plurality of second access lines (e.g., second access line 210 as described with reference to FIG. 2A) may be formed within. The memory structure 400 may also include a plurality of first access lines. For example, memory structure 400 may include first access lines 405 and 405-*a*. The channels 445 and the first access lines may extend in different directions. In some examples, channels 445 may extend in a first direction, and the first access lines may extend in a second direction that is orthogonal to or different from the first direction. Thus, as depicted in FIG. 4, the channels 445 may extend in a first direction (e.g., a "Y" direction), and the plurality of first access lines (e.g., first access line 405) may extend in a second direction (e.g., a "Z" direction that goes in and out of the depicted page) that is orthogonal to the first direction. Accordingly, memory structure 400 (after the formation of first access lines) may be a three-dimensional memory array.

The second plurality of access lines to be formed within channels 445 and the first plurality of access lines may be in contact with a self-selecting memory (e.g., self-selecting memory 215 as described with reference to FIG. 2A). As described above, the plurality of memory cells formed within memory structure 400 may each include a self-selecting memory (not shown). Thus the self-selecting memory (e.g., each memory cell) may be located next to or in contact with the first plurality of access lines and the second plurality of access lines. Stated alternatively, the self-selecting memory may extend in a first direction (e.g., a "Y" direction) and border each of the plurality of second access lines on at least one side. By bordering each of the plurality of access lines, the self-selecting memory may be referred to as being continuous. The self-selecting memory may, in some examples, be located at each intersection of the first plurality of access lines and the second plurality of access lines as well as at other locations between these intersections. At least one memory cell (e.g., memory cell 425) may be located at each intersection of a first access line 405 and a second access line (not shown). As described below, a first dielectric material 420 may be positioned between the first plurality of memory cells and the second plurality of memory cells.

Conversely, the first plurality of access lines (e.g., first access line 405) and the second plurality of access lines (not shown) may be in contact with individual self-selecting memory segments (not shown). In some examples, the individual self-selecting memory segments may be referred to as a plurality of discrete self-selecting memory segments, and memory structure 400 may contain at least a first subset of discrete self-selecting memory segments and a second subset of discrete self-selecting memory segments. Each self-selecting memory segment may be adjacent to or in contact with one access line of the first plurality of access lines and one access line of the second plurality of access lines. Stated alternatively, the self-selecting memory segments may extend in a first direction (e.g., a "Y" direction) and have a similar dimension (e.g., in the "Y" direction) as a first access line (e.g., first access line 405). Thus at least one self-selecting memory segment may be formed at each intersection of access lines (e.g. an intersection of first access line 305 and a second access line (not shown)). Accordingly, memory cell 425 may be located at the intersection of first access line 305 and a second access line (not shown), and a memory cell 325-*a* may be located at the intersection of first access line 305-*a* and second access line (not shown).

In some examples, access line 405 may be referred to as a first access line of the plurality of first access lines and access line 405-*a* may be referred to as a second access line of the plurality of first access lines. As shown in FIG. 4, the first access lines may be separated by a first dielectric material 420. By separating the access lines 405 and 405-*a* by the dielectric material 420, memory cell 425, located at the intersection of first access line 405 and a second access line (not shown), and memory cell 425-*a*, located at the intersection of first access line 405-*a* and a second access line (not shown), may be individually accessed. Stated another way, the presence of dielectric material 420 ensures that first access line 405 may be in communication with a respective second access line (not shown), but not access line 405-*a*. Thus, one memory cell may be activated at a time. But for dielectric material 420, a single access line may extend between second access lines (not shown), resulting in multiple memory cells being activated at any one time.

Additionally or alternatively, memory structure 400 may include second dielectric material 430, third dielectric material (e.g., third dielectric material 435-*a*, third dielectric material 435-*b*), and fourth dielectric material 440. In some examples, each of the first, second, and third dielectric materials, respectively, may be a same dielectric material. In other examples, each of the first, second, and third dielectric materials, respectively, may be a same dielectric material. In further examples, any two of the first, second, and third dielectric materials, respectively, may be a same dielectric material. In some examples, third dielectric material (e.g., third dielectric material 435-*a*, third dielectric material 435-*b*) may include multiple portions that may or may not have different characteristics.

For example, a third dielectric material may include a first portion (e.g., third dielectric material 435-*a* in contact with second dielectric material 430 and fourth dielectric material 440) and a second portion (e.g., third dielectric material 435-*b* in contact with first access lines 405 and 405-*a*). In some examples, the third dielectric material 435-*a* and third dielectric material 435-*b* may be formed at different times. As an example, third dielectric material 435-*b* may be formed before third dielectric material 435-*a*. In other examples, third dielectric material 435-*b* may be formed after third dielectric material 435-*a*. As discussed above, the first dielectric material 420 may separate two access lines, (e.g., second access lines (not shown)) to ensure that memory cells may be individually-selected. The second, third, and fourth dielectric materials may isolate (e.g., electrically isolate) or protect various portions and/or components of the memory structure 400.

As compared with FIGS. 2A, 2B, and 3, the first dielectric material 420 may be deposited in a different manner. For example, as described with references to FIGS. 2A, 2B, and 3, a stack may have been formed that included the first dielectric material. The stack may have been subsequently etched and, as a result, first access lines may have been separated in at least one direction (e.g., an "X" direction). Conversely, for example, in FIG. 4 a stack may be formed that includes a second dielectric material 430, third dielectric material (e.g., third dielectric material 435-*a*, third dielectric material 435-*b*), and fourth dielectric material 440. The stack may be etched, subsequently, to form channels 450. The first dielectric material 420 may then be deposited within each of channels 450 to electrically isolate first and second access lines. For example, the first dielectric material 420 may isolate access line 405 from access line 405-*a*. In some examples, each of channels 445 and 450 may have a different dimension in at least one direction (e.g., an "X" direction). For example, each of channels 445 may be wider than each of channels 450. The width of channels 445 and/or channels 450 may vary. For example, channels 445 may be substantially wider than channels 450. In other examples, channels 450 may be substantially wider than channels 445. In any example, the width of channels 445 and channels 450 may be such that first dielectric material 420 fills channels 450 and does not fill channels 445.

The second, third, and fourth dielectric materials may isolate (e.g., electrically isolate) or protect various portions and/or components of the memory structure 400. Accordingly, first dielectric material 420 and third dielectric material 435-*b* may electrically isolate two or more first access lines (e.g., isolate first access line 405 from first access line 405-*a*). As described above, first dielectric material 420 may isolate each of the first access lines in one direction (e.g., an "X" direction). Third dielectric material may isolate each of the first access lines in a different direction (e.g., a "Y" direction). Thus the combination of first dielectric material 420 and third dielectric material 435-*b* may operate in conjunction to ensure that each of the first access lines are electrically isolated from each other.

Second dielectric material 430 and fourth dielectric material 440 may aid the method of fabricating memory structure 400. For example, as described below with reference to FIGS. 7A through 7E, a stack may be formed that includes, among other materials, second dielectric material 430 and fourth dielectric material 440. The stack may be etched in order to form the plurality of first access lines. For consistency, it is preferable that each etch be a same dimension in at least one direction (e.g., a "Y" direction). Thus fourth dielectric material 440 may be included in the stack to ensure a consistent etch depth. For example, third dielectric material (e.g., third dielectric material 435-*a*, third dielectric material 435-*b*) and fourth dielectric material 440 may be different materials. Thus, during an etching process, at least one channel may be etched through third dielectric material (e.g., in a "Y" direction). However, due to the presence of fourth dielectric material 440, or due to fourth dielectric material 440 being a different material than third dielectric material (e.g., third dielectric material 435-*a*, third dielectric material 435-*b*), the etching process may end upon reaching the fourth dielectric material 440. Accordingly, each of the plurality of second access lines may be formed having a consistent dimension (e.g., in a "Y" direction).

Similarly, second dielectric material 430 may aid in the method of fabricating memory structure 400, as described below with reference to FIGS. 7A through 7E. As described above, a stack may be formed that includes, among other materials, second dielectric material 430 and third dielectric material (e.g., third dielectric material 435-*a*, third dielectric material 435-*b*), and may be etched in order to form the plurality of second access lines (not shown). In some examples, the etch depth in at least one direction (e.g., a "Y" direction) may be such that the etching process may degrade the openings (e.g., vias or holes) in which the second access lines may be formed. For example, openings having a greater dimension in at least one direction (e.g., a "Y" direction) may be more susceptible to degradation. Accordingly, the presence of second dielectric material 430 may aid the fabrication process such that the etching process results in consistent openings and, ultimately consistent second access lines formed therein.

Figure 5:
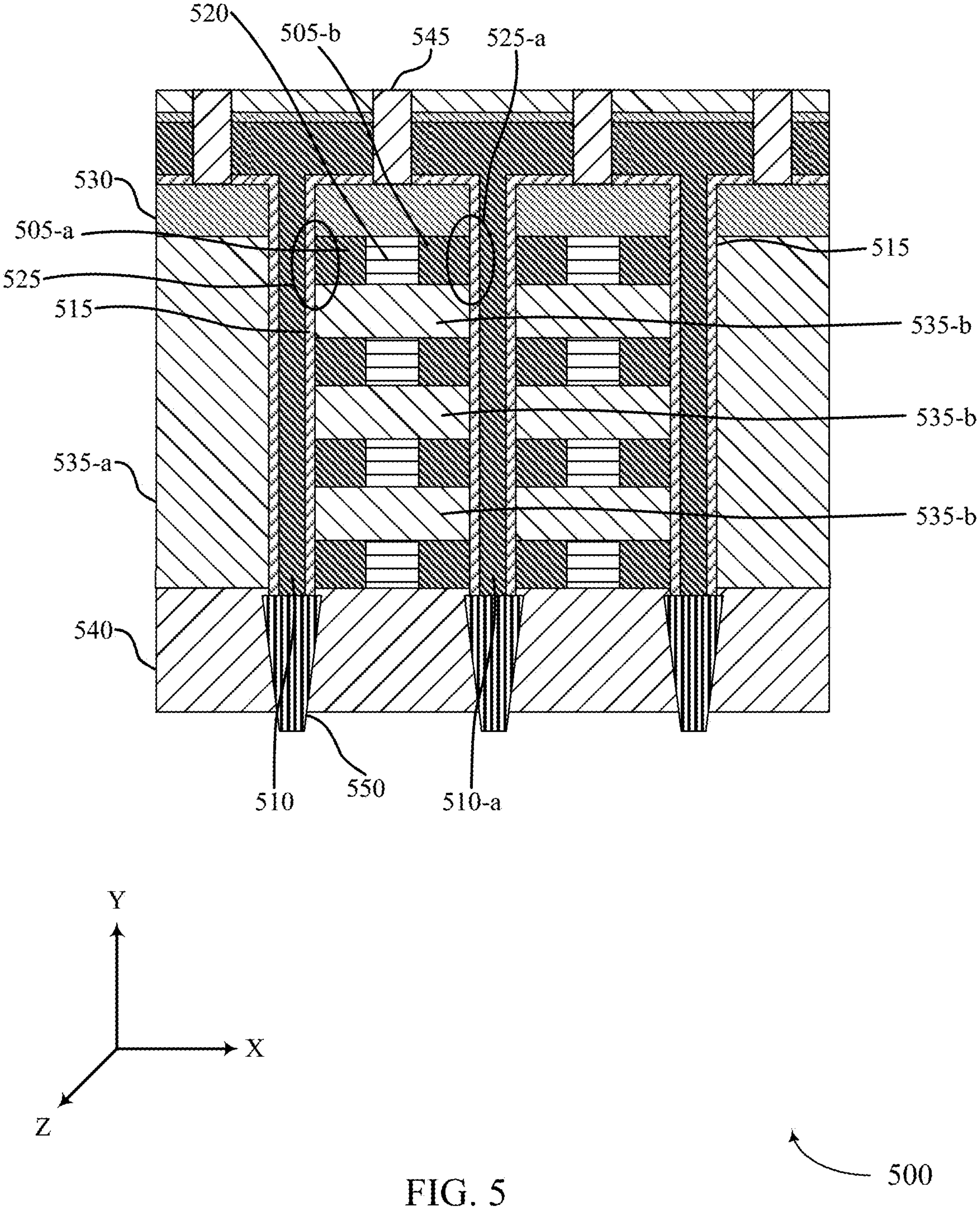

FIG. 5 illustrates an example of a self-selecting memory structure 500 that includes horizontal bit lines in accordance with examples of the present disclosure. The memory structure 500 may be an example of, or may include features described with respect to memory structures 200-*a*, and 200-*b*, 300, and 400 as described with reference to FIGS. 2A, 2B, 3, and 4, respectively. The memory structure 500 may include a three-dimensional memory array that includes first access lines extending in a first direction and second access lines extending in a second, different direction. The access lines may form a three-dimensional structure (e.g., a grid) that includes a memory cell at the intersection of access lines (e.g., the intersection of a first access line 505 and a second access line 510). In some examples, the memory array may include a plurality of plugs 550.

In some examples, memory structure 500 may include first access lines 505 and 505-*a*, which may be an example of first access lines 205 and 205-*a* as described with reference to FIG. 2A; second access lines 510 and 510-*a*, which may be an example of second access lines 210 and 210-*a* as described with reference to FIG. 2A; and self-selecting material 515, which may be an example of self-selecting memory 215 as described with reference to FIG. 2A. In other examples, the memory structure 500 may include first dielectric material 520, which may be an example of first dielectric material 220 as described with reference to FIG. 2A; second dielectric material 530, which may be an example of second dielectric material 230 as described with reference to FIG. 2A; third dielectric material (e.g., third dielectric material 535-*a*, third dielectric material 535-*b*), which may be an example of third dielectric material (e.g., third dielectric material 235-*a*, third dielectric material 235-*b*) as described with reference to FIG. 2A; and fourth dielectric material 540, which may be an example of fourth dielectric material 240 as described with reference to FIG. 2A. Memory structure 500 may also include memory cell 525 and memory cell 525-*a*, which may be examples of memory cells 225 and 225-*a* as described with reference to FIG. 2B.

Memory structure 500 may also include a plurality of plugs 550 in contact with one or more second access lines (e.g., second access line 510), and one or more second access lines may include isolation regions 545. In some examples, the first access lines may be referred to as bit lines and the second access lines may be referred to as word lines. In other examples, the second dielectric material 530 may be referred to as a protective dielectric material 530, and the fourth dielectric material 540 may be referred to as an insulating dielectric material 540.

In some examples, the memory structure 500 may include a plurality first access lines 505 and 505-*a*, and a plurality of second access lines 510 and 510-*a*. The first access lines and the second access lines may extend in different directions (e.g., orthogonal directions, other non-parallel directions). For example, as described above, first access lines (e.g., first access line 505) may be referred to as horizontal access lines and may extend in a horizontal direction, and the second access lines (e.g., second access line 510) may be referred to as vertical access lines and may extend in a vertical direction. In some examples, the first access lines may extend in a first direction, and the second access lines may extend in a second direction that is different from (e.g., orthogonal to) the first direction. Thus, as depicted in FIG. 5, the plurality of first access lines may extend in a first direction (e.g., a "Z" direction that goes in and out of the depicted page), and the second plurality of access lines may extend in a second direction (e.g., a "Y" direction) that is orthogonal to the first direction. Accordingly, memory structure 500 may be a three-dimensional memory array with a first plurality of access lines and a second plurality of access lines forming a grid-like structure.

The first plurality of access lines and the second plurality of access lines may be in contact with a self-selecting memory 515 (e.g., self-selecting memory 215 as described with reference to FIG. 2A). As described above, the plurality of memory cells formed within memory structure 500 may each include a self-selecting memory 515. Thus the self-selecting memory (e.g., each memory cell) may be located next to the first plurality of access lines and the second plurality of access lines. Stated alternatively, the self-selecting memory 515 may extend in a first direction (e.g., a "Y" direction) direction and border each of the plurality of second access lines on at least one side. By bordering each of the plurality of access lines, the self-selecting memory 515 may be referred to as being continuous. The self-selecting memory 515 may, in some examples, be located at each intersection of the first plurality of access lines and the second plurality of access lines as well as at other locations between these intersections. At least one memory cell (e.g., memory cell 525) may be located at each intersection of a first access line 505 and a second access line 510. As described below, a first dielectric material 520 may be positioned between the first plurality of memory cells and the second plurality of memory cells.

In other examples, the first plurality of access lines (e.g., first access line 505) and the second plurality of access lines (e.g., second access line 510) may be in contact with individual self-selecting memory segments (not shown). In some examples, the individual self-selecting memory segments may be referred to as a plurality of discrete self-selecting memory segments, and memory structure 500 may contain at least a first subset of discrete self-selecting memory segments and a second subset of discrete self-selecting memory segments. Each self-selecting memory segment may be adjacent to or in contact with one access line of the first plurality of access lines and one access line of the second plurality of access lines. Stated alternatively, the self-selecting memory segments may extend in a first direction (e.g., a "Y" direction) and may have a similar dimension (e.g., in the "Y" direction) as a first access line (e.g., first access line 505). Thus at least one self-selecting memory segment may be formed at each intersection of access lines (e.g. an intersection of first access line 505 and a second access line 510). Accordingly, memory cell 525 may be located at the intersection of first access line 505 and a second access line 510, and a memory cell 525-*a* may be located at the intersection of first access line 505-*a* and second access line 510-*a*.

In some examples, access line 510 may be referred to as a first access line of the plurality of second access lines and access line 510-*a* may be referred to as a second access line of the plurality of second access lines. In some examples, the plurality of second access lines may be shunted in at least one direction. In other examples, each of access lines 505 and 505-*a* may be referred to as first access lines. Additionally or alternatively, access line 505 may be referred to as a first access line of the plurality of first access lines and access line 505-*a* may be referred to as a second access line of the plurality of first access lines. As shown in FIG. 5, the first access lines 505 and 505-*a* may be separated by a first dielectric material 520. By separating the first access lines 505 and 505-*a* by the dielectric material 520, memory cells located at the intersection of second access line 510 and a first access line 505, and the intersection of second access line 510-*a* and a first access line 505-*a* may be individually accessed. Stated another way, the presence of dielectric material 520 ensures that access line 510 may be in communication with access line 505, but not access line 505-*a*. Thus, one memory cell may be activated at a time. But for dielectric material 520, a single access line may extend from second access line 510 to second access line 510-*a*, resulting in multiple memory cells being activated at any one time.

As described above, memory cells (e.g., memory cells 225 as described with reference to FIG. 2B) may be accessed by activating a relevant word line and bit line. Thus, each of the memory cells may be accessed by activating one of the plurality of first access lines and one of the plurality of second access lines. For example, a memory cell located at the intersection of first access line 505 and second access line 510 may be activated at a same time that a memory cell located at the intersection of first access line 505-*a* and second access line 510-*a* is unselected. Alternatively, for example, a memory cell located at the intersection of first access line 505-*a* and second access line 510-*a* may be activated at a same time that a memory cell located at the intersection of first access line 505 and second access line 510 is unselected. The presence of first dielectric material 520 located between the memory cells may allow for memory cell 525 (e.g., at the intersection of access line 505 and access line 510) to be accessed at a same time that a second memory cell 525-*a* (e.g., at the intersection of access line 505-*a* and access line 510-*a*) is unselected.

Additionally or alternatively, the presence of self-selecting memory 515 in each memory cell may enhance differences in a threshold voltage of the memory cells between different programmed states. For example, as described above, if the applied voltage is less than the threshold voltage, no current may flow if the memory element is in the amorphous (e.g., reset) state; if the memory element is in the crystalline (e.g., set) state, it may have a different threshold voltage and, thus, a current may flow in response to the applied voltage. Thus each memory cell may be accessed by applying programming pulses of different polarities to the respective memory cell.

In some examples, isolation regions 545, at least one plug 550, or both may facilitate or aid the activation of memory cell 525 while another memory cell (e.g., memory cell 525-*a*) is unselected. Isolation regions 545 may isolate one or more portions of the plurality of second access lines. In some examples, this may be referred to as a cut access line. Stated alternatively, the access lines may be portioned (e.g., cut or isolated) such that a memory cell located at the intersection of a first and second access line may be activated at any one time. For example one or more of isolation regions 545 may allow for a corresponding portion of second access line 510 to be activated such that a memory cell located at the intersection of first access line 505 and access line 510 is activated, while a memory cell located at the intersection of access line 505-*a* and access line 510-*a* is unselected. Additionally or alternatively, each of plugs 550 may be in contact with an end (e.g., a second end) of each of the plurality of second access lines 510. Thus one or more of the plurality of plugs 550 may allow for a current to be applied across a corresponding portion of second access line 510 such that a memory cell located at the intersection of access line 505 and access line 510 is activated, while a memory cell located at the intersection of access line 505-*a* and access line 510-*a* is unselected.

Additionally or alternatively, memory structure 500 may include second dielectric material 530, third dielectric material (e.g., third dielectric material 535-*a*, third dielectric material 535-*b*), and fourth dielectric material 540. In some examples, each of the first, second, and third dielectric materials, respectively, may be a same dielectric material. In other examples, each of the first, second, and third dielectric materials, respectively, may be a same dielectric material. In further examples, any two of the first, second, and third dielectric materials, respectively, may be a same dielectric material. In some examples, third dielectric material (e.g., third dielectric material 535-*a*, third dielectric material 535-*b*) may include multiple portions that may or may not have different characteristics. For example, a third dielectric material may include a first portion (e.g., third dielectric material 535-*a* in contact with second dielectric material 530 and fourth dielectric material 540) and a second portion (e.g., third dielectric material 535-*b* in contact with first access lines 505 and 505-*a*).

In some examples, the third dielectric material 535-*a* and third dielectric material 535-*b* may be formed at different times. For example, third dielectric material 535-*b* may be formed before third dielectric material 535-*a*. In other examples, third dielectric material 535-*b* may be formed after third dielectric material 535-*a*. As discussed above, the first dielectric material 520 may separate two access lines, (e.g., access lines 505 and 505-*a*) to ensure that memory cells may be individually-selected. The second, third, and fourth dielectric materials may isolate (e.g., electrically isolate) or protect various portions and/or components of the memory array 500.

As an example, first dielectric material 520 and third dielectric material 535-*b* may electrically isolate each of first access lines. For example, first dielectric material 520 may isolate first access line 505 from first access line 505-*a* in one direction (e.g., an "X" direction). Third dielectric material 535-*b* may isolate second access line 510 from second access line 510-*a* in a same direction (e.g., an "X" direction). In other examples, third dielectric material 535-*b* may isolate one or more of first access lines 505 and 505-*a* from an additional first access line (not shown) in a second direction (e.g., a "Y" direction). Thus the combination of first dielectric material 520 and third dielectric material 535-*b* may operate in conjunction to ensure that multiple access lines (e.g., second access line 510 and second access line 510-*a*) are electrically isolated from each other.

Second dielectric material 530 and fourth dielectric material 540 may aid the method of fabricating memory structure 500. For example, as described below with reference to FIGS. 7A through 7E, a stack may be formed that includes, among other materials, second dielectric material 530 and fourth dielectric material 540. The stack may be etched in order to form the plurality of first access lines. For consistency, it is preferable that each etch be a same dimension in at least one direction (e.g., a "Y" direction). Thus fourth dielectric material 540 may be included in the stack to ensure a consistent etch depth. For example, third dielectric material (e.g., third dielectric material 535-*a*, third dielectric material 535-*b*) and fourth dielectric material 540 may be different materials. Thus, during an etching process, at least one channel may be etched through third dielectric material (e.g., in a "Y" direction). However, due to the presence of fourth dielectric material 540, or due to fourth dielectric material 540 being a different material than third dielectric material (e.g., third dielectric material 535-*a*, third dielectric material 535-*b*), the etching process may end upon reaching the fourth dielectric material 540. Accordingly, each of the plurality of second access lines may be formed having a consistent dimension (e.g., in a "Y" direction).

Similarly, second dielectric material 530 may aid in the method of fabricating memory structure 500, as described below with reference to FIGS. 7A through 7E. As described above, a stack may be formed that includes, among other materials, second dielectric material 530 and third dielectric material (e.g., third dielectric material 535-*a*, third dielectric material 535-*b*), and may be etched in order to form the plurality of second access lines (e.g., second access line 510). In some examples, the etch depth in at least one direction (e.g., a "Y" direction) may be such that the etching process may degrade the openings (e.g., vias or holes) in which the second access lines may be formed. For example, openings having a greater dimension in at least one direction (e.g., a "Y" direction) may be more susceptible to degradation. Accordingly, the presence of second dielectric material 530 may aid the fabrication process such that the etching process results in consistent openings and, ultimately consistent second access lines formed therein.

Figure 6:
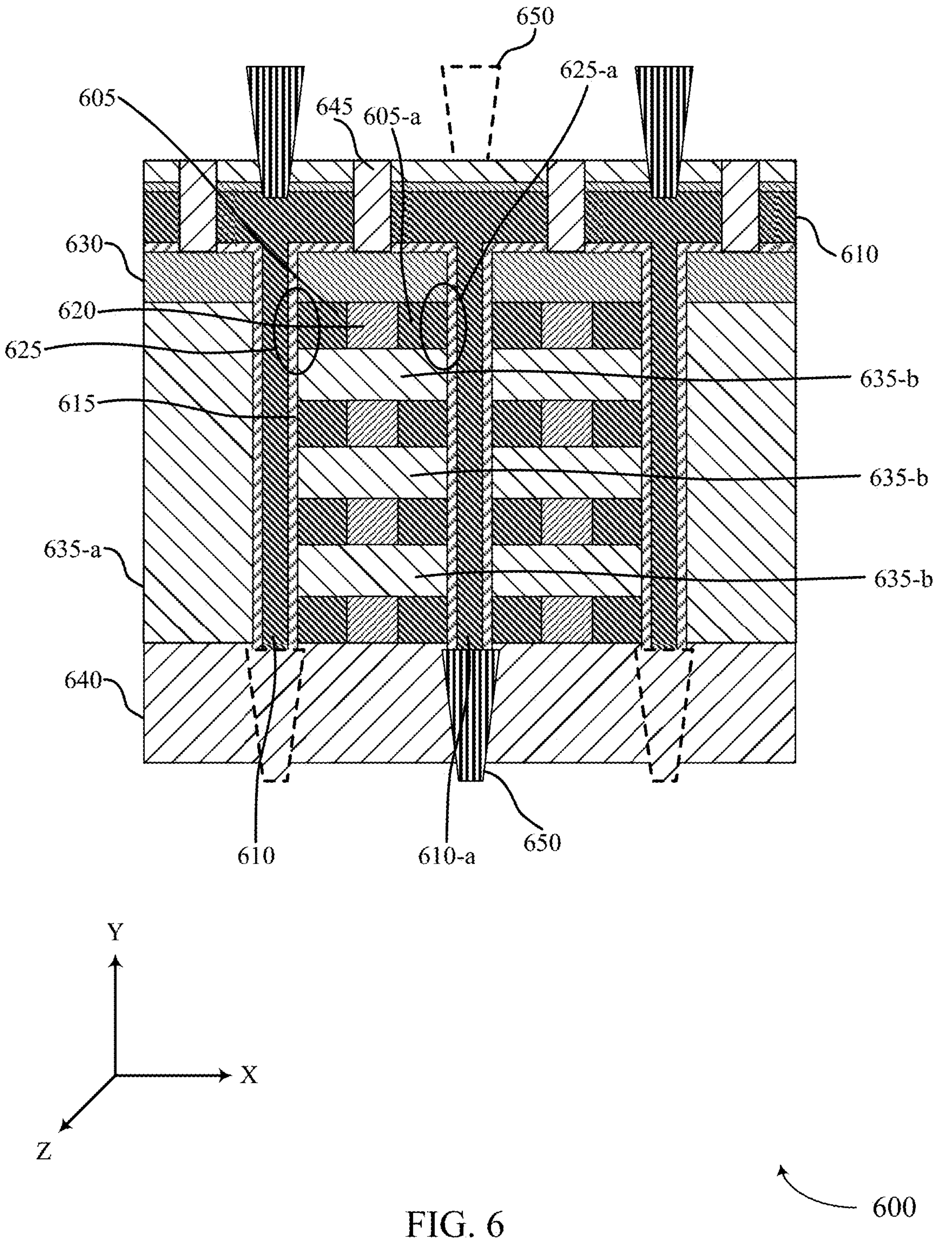

FIG. 6 illustrates an example of a self-selecting memory structure 600 that includes horizontal bit lines in accordance with examples of the present disclosure. The memory structure 600 may be an example of, or may include features described with respect to memory structures 200-*a*, and 200-*b*, 300, 400, and 500 as described with reference to FIGS. 2A, 2B, 3, 4, and 5, respectively. The memory structure 600 may include a three-dimensional memory array that includes first access lines extending in a first direction and second access lines extending in a second, different direction. The access lines may form a three-dimensional structure (e.g., a grid) that includes a memory cell at the intersection of access lines (e.g., the intersection of a first access line 605 and a second access line 610). In some examples, the memory array may include a plurality of plugs 650.

In some examples, memory structure 600 may include first access lines 605 and 605-*a*, which may be an example of first access lines 205 and 205-*a* as described with reference to FIG. 2A; second access lines 610 and 610-*a*, which may be an example of second access lines 210 and 210-*a* as described with reference to FIG. 2A; and self-selecting material 615, which may be an example of self-selecting memory 215 as described with reference to FIG. 2A. Memory structure 600 may also include first dielectric material 620, which may be an example of first dielectric material 220 as described with reference to FIG. 2A; second dielectric material 630, which may be an example of second dielectric material 230 as described with reference to FIG. 2A; third dielectric material (e.g., third dielectric material 635-*a*, third dielectric material 635-*b*), which may be an example of third dielectric material (e.g., third dielectric material 235-*a*, third dielectric material 235-*b*) as described with reference to FIG. 2A; and fourth dielectric material 640, which may be an example of fourth dielectric material 240 as described with reference to FIG. 2A. In some examples, memory structure 600 may include memory cells 625 and 625-*a*, which may be an example of memory cells 225 and 225-*a* as described with reference to FIG. 2B.

Memory structure 600 may also include a plurality of plugs 650 in contact with one or more second access lines, and may include one or more isolation regions 645. In some examples, the first access lines may be referred to as bit lines and the second access lines may be referred to as word lines. In other examples, the second dielectric material 630 may be referred to as a protective dielectric material 630, and the fourth dielectric material 640 may be referred to as an insulating dielectric material 640.

In some examples, the memory structure 600 may include a plurality first access lines 605 and 605-*a*, and a plurality of second access lines 610 and 610-*a*. The first access lines and the second access lines may extend in different directions (e.g., orthogonal directions, other non-parallel directions). For example, as described above, first access lines may be referred to as horizontal access lines and may extend in a horizontal direction, and the second access lines may be referred to as vertical access lines and may extend in a vertical direction. In some examples, the first access lines may extend in a first direction, and the second access lines may extend in a second direction that is different from (e.g., orthogonal to) the first direction. Thus, as depicted in FIG. 6, the plurality of first access lines may extend in a first direction (e.g., a "Z" direction that goes in and out of the depicted page), and the second plurality of access lines may extend in a second direction (e.g., a "Y" direction) that is orthogonal to the first direction. Accordingly, memory structure 600 may be a three-dimensional memory array with a first plurality of access lines and a second plurality of access lines forming a grid-like structure.

The first plurality of access lines and the second plurality of access lines may be in contact with a self-selecting memory 615 (e.g., self-selecting memory 215 as described with reference to FIG. 2A). As described above, the plurality of memory cells formed within memory structure 600 may each include a self-selecting memory 615. Thus the self-selecting memory (e.g., each memory cell) may be located next to or be in contact with the first plurality of access lines and the second plurality of access lines. Stated alternatively, the self-selecting memory 615 may extend in a first direction (e.g., a "Y" direction) and border each of the plurality of second access lines on at least one side. By bordering each of the plurality of access lines, the self-selecting memory 615 may be referred to as being continuous. The self-selecting memory 615 may, in some examples, be located at each intersection of the first plurality of access lines and the second plurality of access lines as well as at other locations between these intersections. At least one memory cell (e.g., memory cell 625) may be located at each intersection of a first access line 605 and a second access line 610. As described below, a first dielectric material 620 may be positioned between the first plurality of memory cells and the second plurality of memory cells.

Conversely, the first plurality of access lines (e.g., first access line 605) and the second plurality of access lines (e.g., second access line 610) may be in contact with individual self-selecting memory segments (not shown). In some examples, the individual self-selecting memory segments may be referred to as a plurality of discrete self-selecting memory segments, and memory structure 600 may contain at least a first subset of discrete self-selecting memory segments and a second subset of discrete self-selecting memory segments. Each self-selecting memory segment may be adjacent to or in contact with one access line of the first plurality of access lines and one access line of the second plurality of access lines. Stated alternatively, the self-selecting memory segments may extend in a first direction (e.g., a "Y" direction) and have a similar dimension (e.g., in the "Y" direction) as a first access line (e.g., first access line 605). Thus at least one self-selecting memory segment may be formed at each intersection of access lines (e.g. an intersection of first access line 605 and a second access line 610). Accordingly, memory cell 625 may be located at the intersection of first access line 605 and a second access line 610, and a memory cell 625-*a* may be located at the intersection of first access line 605-*a* and second access line 610-*a*.

In some examples, each of access lines 610 and 610-*a* may be referred to as second access lines. As described above, access line 610 may be referred to as a first access line of the plurality of second access lines and access line 610-*a* may be referred to as a second access line of the plurality of second access lines. In some examples, access line 605 may be referred to as a first access line of the plurality of first access lines and access line 605-*a* may be referred to as a second access line of the plurality of first access lines.

As shown in FIG. 6, in some examples, the first access lines 605 and 605-*a* may be separated by a first dielectric material 620. By separating the first access lines 605 and 605-*a* by the dielectric material 620, a memory cell 625 may be located at the intersection of second access line 610 and a first access line 605, and a memory cell 625-*a* may be located at the intersection of second access line 610-*a* and a first access line 605-*a*. Memory cell 625 and memory cell 625-*a* may be individually accessed. Stated another way, the presence of dielectric material 620 ensures that access line 610 may be in communication with access line 605, but not access line 605-*a*. Thus, one memory cell may be activated at a time. But for dielectric material 620, a single access line may extend from second access line 610 to second access line 610-*a*, resulting in multiple memory cells being activated at any one time.

As described above, memory cells (e.g., memory cells 225 as described with reference to FIG. 2B) may be accessed by activating a relevant word line and bit line. Thus, each of the memory cells may be accessed by activating one of the plurality of first access lines and one of the plurality of second access lines. For example, a memory cell located at the intersection of first access line 605 and second access line 610 may be activated at a same time that a memory cell located at the intersection of first access line 605-*a* and second access line 610-*a* is unselected. Alternatively, for example, a memory cell located at the intersection of first access line 605-*a* and second access line 610-*a* may be activated at a same time that a memory cell located at the intersection of first access line 605 and second access line 610 is unselected. The presence of first dielectric material 620 located between the memory cells may allow for memory cell 625 (e.g., at the intersection of access line 605 and access line 610) to be accessed at a same time that a second memory cell 625-*a* (e.g., at the intersection of access line 605-*a* and access line 610-*a*) is unselected.

Additionally or alternatively, the presence of self-selecting memory 615 in each memory cell may enhance differences in a threshold voltage of the memory cells between different programmed states. For example, as described above, if the applied voltage is less than the threshold voltage, no current may flow if the memory element is in the amorphous (e.g., reset) state; if the memory element is in the crystalline (e.g., set) state, it may have a different threshold voltage and, thus, a current may flow in response to the applied voltage. Thus each memory cell may be accessed by applying programming pulses of different polarities to the respective memory cell.

In some examples, isolation regions 645, the plurality of plugs 650, or both may facilitate or aid the activation of one memory cell 625 while another memory cell (e.g., memory cell 625-*a*) is unselected. Isolation regions 645 may isolate one or more portions of the plurality of second access lines (e.g., isolate second access line 610 from second access line 610-*a*). In some examples, this may be referred to as a cut access line. Stated alternatively, the second access lines may portioned (e.g., cut or isolated) such that one line may be activated at any one time. For example, one or more of isolation regions 645 may allow for a corresponding portion of second access line 610 to be activated such that a memory cell located at the intersection of access line 605-*a* and access line 610-*a* is activated, while a memory cell located at the intersection of access line 605 and access line 610 is unselected.

Additionally or alternatively, each of plugs 650 may be in contact with an end of each of the plurality of second access lines. For example, a first plurality of plugs 650 may be in contact with a first end of each of the second access lines, and a second plurality of plugs 650 may be in contact with a second end of each of the second access lines. In some examples, zero, one, or two ends of each of the plurality of second access lines may be in contact with one of the plurality of plugs 650. Thus, one or more of the plurality of plugs 650 may allow for a current to be applied across a corresponding portion of a second access line such that a memory cell located at the intersection of access line 605-*a* and access line 610-*a* is activated, while a memory cell located at the intersection of access line 605 and access line 610 is unselected.

Additionally or alternatively, memory structure 600 may include second dielectric material 630, third dielectric material (e.g., third dielectric material 635-*a*, third dielectric material 635-*b*), and fourth dielectric material 640. In some examples, each of the first, second, and third dielectric materials, respectively, may be a same dielectric material. In other examples, each of the first, second, and third dielectric materials, respectively, may be a same dielectric material. In further examples, any two of the first, second, and third dielectric materials, respectively, may be a same dielectric material. In some examples, third dielectric material (e.g., third dielectric material 635-*a*, third dielectric material 635-*b*) may include multiple portions that may or may not have different characteristics. For example, a third dielectric material may include a first portion (e.g., third dielectric material 635-*a* in contact with second dielectric material 630 and fourth dielectric material 640) and a second portion (e.g., third dielectric material 635-*b* in contact with first access lines 605 and 605-*a*).

In some examples, the third dielectric material 635-*a* and third dielectric material 635-*b* may be formed at different times. For example, third dielectric material 635-*b* may be formed before third dielectric material 635-*a*. In other examples, third dielectric material 635-*b* may be formed after third dielectric material 635-*a*. As discussed above, the first dielectric material 620 may separate two access lines, (e.g., access lines 605 and 605-*a*) to ensure that memory cells may be individually-selected. The second, third, and fourth dielectric materials may isolate (e.g., electrically isolate) or protect various portions and/or components of the memory array 600.

As an example, first dielectric material 620 and third dielectric material 635-*b* may electrically isolate each of first access lines. For example, first dielectric material 620 may isolate first access line 605 from first access line 605-*a* in one direction (e.g., an "X" direction). Third dielectric material 635-*b* may isolate second access line 610 from second access line 610-*a* in a same direction (e.g., an "X" direction). In other examples, third dielectric material 635-*b* may isolate one or more of first access lines 605 and 605-*a* from an additional first access line (not shown) in a second direction (e.g., a "Y" direction). Thus the combination of first dielectric material 610 and third dielectric material 635-*b* may operate in conjunction to ensure that multiple access lines (e.g., second access line 610 and second access line 610-*a*) are electrically isolated from each other.

Second dielectric material 630 and fourth dielectric material 640 may aid the method of fabricating memory structure 600. For example, as described below with reference to FIGS. 7A through 7E, a stack may be formed that includes, among other materials, second dielectric material 630 and fourth dielectric material 640. The stack may be etched in order to form the plurality of first access lines. For consistency, it is preferable that each etch be a same dimension in at least one direction (e.g., a "Y" direction). Thus fourth dielectric material 640 may be included in the stack to ensure a consistent etch depth. For example, third dielectric material (e.g., third dielectric material 635-*a*, third dielectric material 635-*b*) and fourth dielectric material 640 may be different materials. Thus, during an etching process, at least one channel may be etched through third dielectric material (e.g., in a "Y" direction). However, due to the presence of fourth dielectric material 640, or due to fourth dielectric material 640 being a different material than third dielectric material (e.g., third dielectric material 635-*a*, third dielectric material 635-*b*), the etching process may end upon reaching the fourth dielectric material 640. Accordingly, each of the plurality of second access lines may be formed having a consistent dimension (e.g., in a "Y" direction).

Similarly, second dielectric material 630 may aid in the method of fabricating memory structure 600, as described below with reference to FIGS. 7A through 7E. As described above, a stack may be formed that includes, among other materials, second dielectric material 630 and third dielectric material (e.g., third dielectric material 635-*a*, third dielectric material 635-*b*), and may be etched in order to form the plurality of second access lines (e.g., second access line 610). In some examples, the etch depth in at least one direction (e.g., a "Y" direction) may be such that the etching process may degrade the openings (e.g., vias or holes) in which the second access lines may be formed. For example, openings having a greater dimension in at least one direction (e.g., a "Y" direction) may be more susceptible to degradation. Accordingly, the presence of second dielectric material 630 may aid the fabrication process such that the etching process results in consistent openings and, ultimately consistent second access lines formed therein.

Figure 7A:
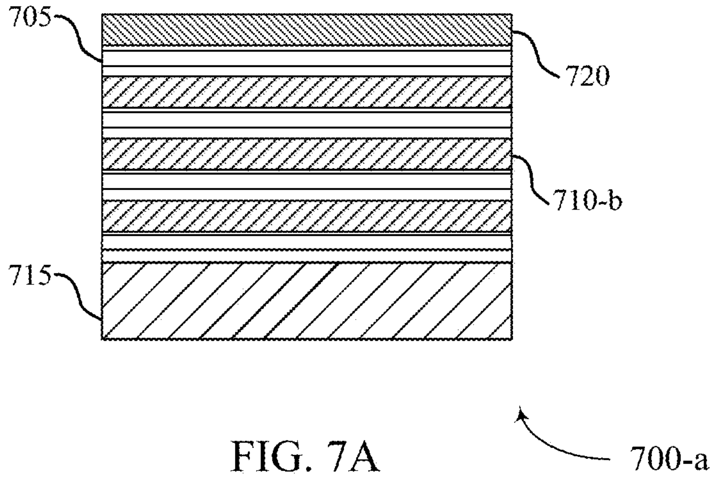
FIGS. 7A through 7E illustrate an example method of forming a self-selecting memory array that includes horizontal access lines in accordance with examples of the present disclosure.

FIGS. 7A through 7E illustrate example methods of forming a self-selecting memory structure that includes horizontal bit lines in accordance with examples of the present disclosure. In FIG. 7A, processing step 700-*a* is depicted. In processing step 700-*a*, a stack may be formed that includes a first dielectric material 705, which may be an example of first dielectric material 220 as described with reference to FIG. 2A; a second dielectric material 720, which may be an example of second dielectric material 230 as described with reference to FIG. 2A; and a third dielectric material (e.g., third dielectric material 710-*a*, third dielectric material 710-*b*), which may be an example of third dielectric material (e.g., third dielectric material 235-*a*, third dielectric material 235-*b*) as described with reference to FIG. 2A. In some examples, the stack may also include a fourth dielectric material 715, which may be an example of fourth dielectric material 240 as described with reference to FIG. 2A. In some examples, a plurality of plugs (e.g., plugs 550 as described with reference to FIG. 5) may be formed on at least one side of the stack.

Figure 7B:
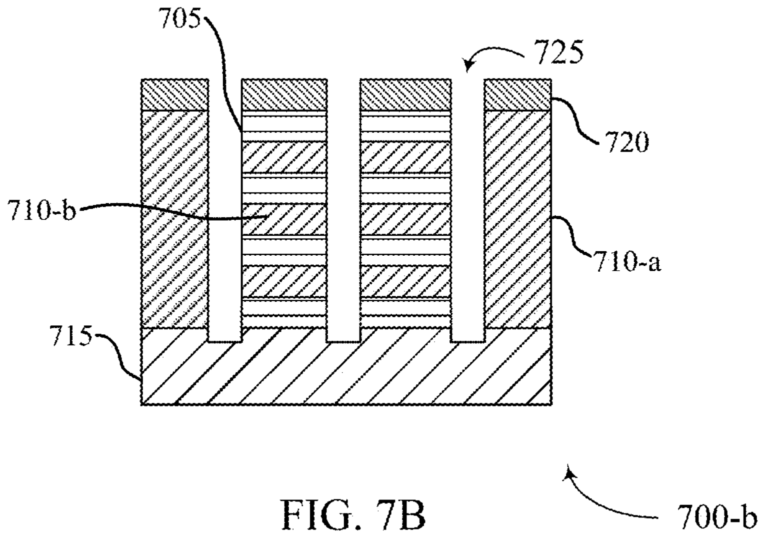

In FIG. 7B, processing step 700-*b* is depicted. In processing step 700-*b* a removal of material in a first direction may occur. The removal of material may result in a plurality of lines (e.g., trenches) 725 that extend in a first direction (e.g., a "Y" direction) and a second direction (e.g., a "Z" direction) and may extend through the first dielectric material 705, the second dielectric material 720, and at least a portion of the third dielectric material 710-*a*. In some examples, the plurality of lines 725 may also extend through the fourth dielectric material 715. In some examples, the plurality of lines 725 may be formed by an isotropic etching technique. As described above, dielectric material 705 may be a different material than, for example, second dielectric material 720 or third dielectric material (e.g., third dielectric material 710-*a*, third dielectric material 710-*b*) to facilitate the creation of uniform lines 725. In some examples, processing step 700-*b* may result in the third dielectric material (e.g., third dielectric material 710-*a*, third dielectric material 710-*b*) having multiple portions. For example, a third dielectric material may include a first portion (e.g., third dielectric material 710-*a* in contact with second dielectric material 720 and fourth dielectric material 715) and a second portion (e.g., third dielectric material 710-*b* in contact with first dielectric material 705). In some examples, the third dielectric material 710-*a* and third dielectric material 710-*b* may be formed at different times. For example, third dielectric material 710-*b* may be formed before third dielectric material 710-*a*. In other examples, third dielectric material 710-*b* may be formed after third dielectric material 710-*a*.

Figure 7C:
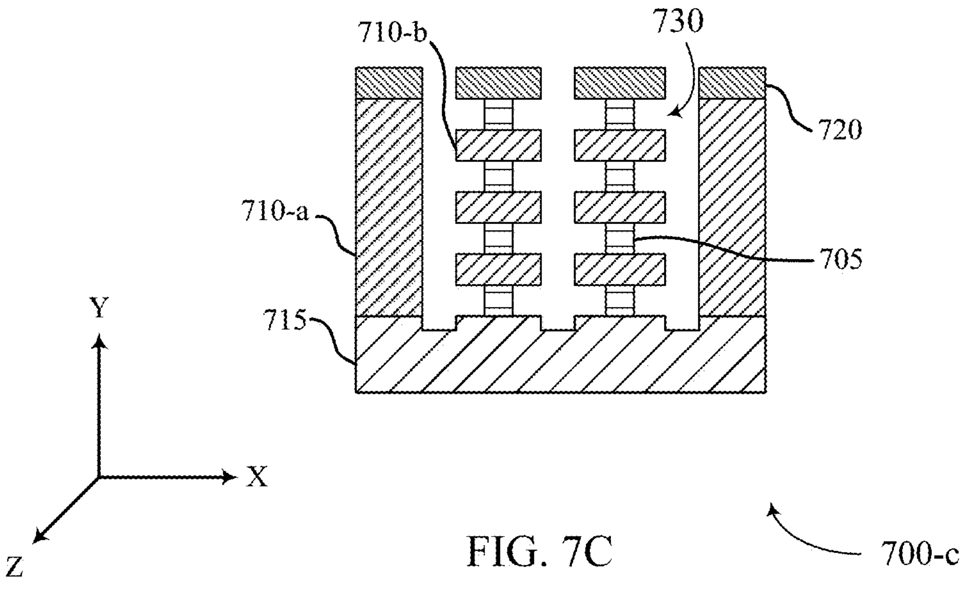

In FIG. 7C, processing step 700-*c* is depicted. In processing step 700-*c* a removal of material in a second direction may occur. The removal of material may result in a plurality of lines 730 that extend in a second direction (e.g., a "Z" that goes in and out of the depicted page) and may extend through at least a portion of the first dielectric material 705. This removal of material may serve as a placeholder for one or more first access lines (e.g., first access line 205 as described with reference to FIG. 2A) to be formed. In some examples, the plurality of lines 730 may be formed by a selective isotropic etching technique.

Figure 7D:
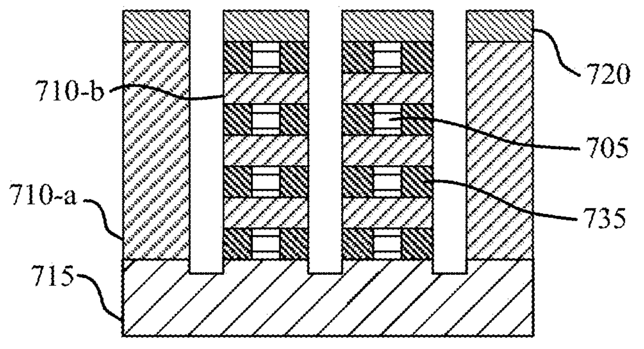

In FIG. 7D, processing step 700-*d* is depicted. In processing step 700-*d* a plurality of first access lines 735 may be formed. In some examples, first access lines 735 may be formed by depositing a conductive material, followed by isotropically etching lines 725. Processing step 700-*d* may be an example of forming a plurality of first access lines 735 in contact with the first dielectric material 705. In some examples, the first access lines 735 may be examples of first access line 205 as described with reference to FIG. 2A, and may be in contact with the first dielectric material 705. Additionally or alternatively, each of the first access lines may be in contact with one of the plurality of lines 725 (e.g., created during processing step 700-*b*). The first access lines 735 may be formed from a conductive material.

Figure 7E:
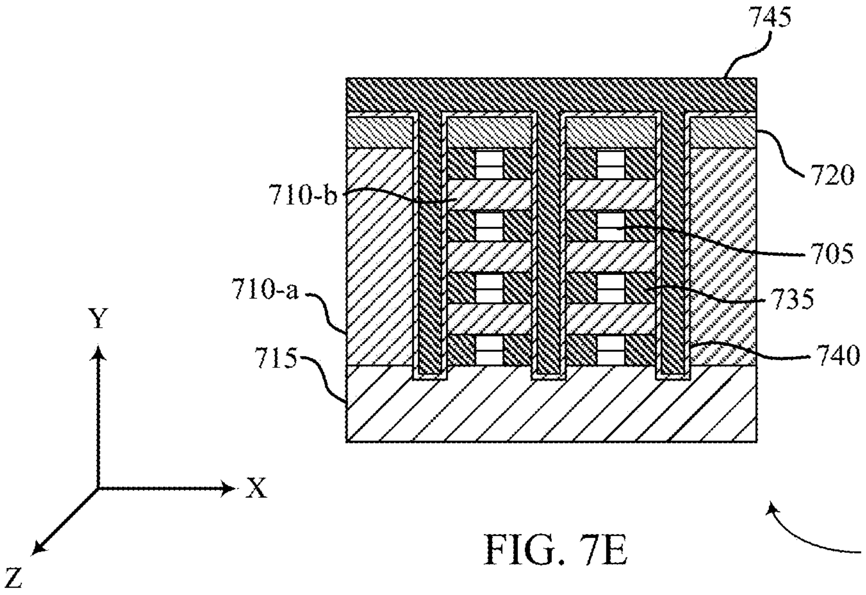

In FIG. 7E, processing step 700-*e* is depicted. In processing step 700-*e*, self-selecting material 740 may be deposited. In some examples, self-selecting memory 740 may be an example of self-selecting memory 215 as described with reference to FIG. 2A. In some examples, depositing self-selecting memory 740 may be an example of depositing self-selecting memory 740 to form a plurality of memory cells in contact with at least a part of a plurality of second access lines 745, the plurality of second access lines 745 in contact with the self-selecting memory 740. Accordingly, a plurality of second access lines 745 may be formed after depositing self-selecting memory 740. The plurality of second access lines 745 may be formed, for example, by filling lines 725 with a conductive material. The conductive material may then be patterned into electrically isolated lines along at least one direction (e.g., a "Z" direction). During such a patterning operation, conductive material may be selectively removed and replaced with a dielectric material (not shown). In some examples, the plurality of second access lines 745 may be examples of second access lines 210 as described with reference to FIG. 2A, and may be in contact with self-selecting memory 740. Additionally or alternatively, for example, one or more portions of the second access line 745 may be etched to create one or more isolation regions (e.g., isolation region 545 as described with reference to FIG. 5), and one or more pluralities of plugs (e.g., plugs 550 as described with reference to FIG. 5) may be formed in contact with a first end of the second access line 745. In some examples, the isolation regions may isolate a conductive material (e.g., second access lines 745) in at least one direction (e.g., an "X" direction).

Figure 8A:
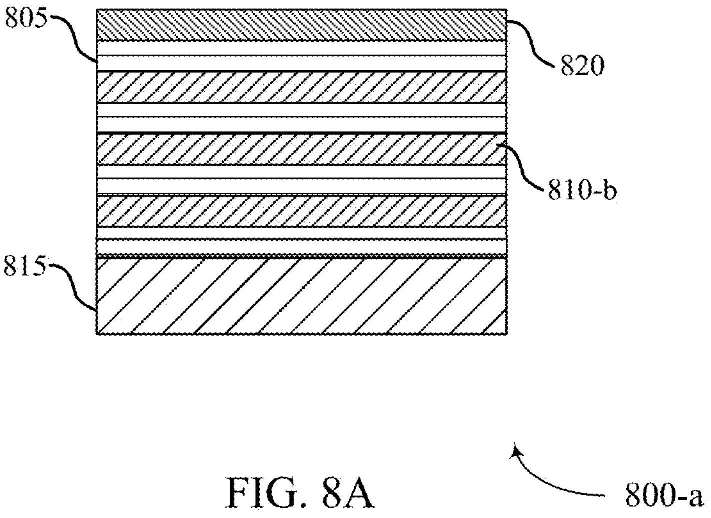
FIGS. 8A through 8E illustrate an example method of forming a self-selecting memory array that includes horizontal access lines in accordance with examples of the present disclosure.

FIG. 8A through 8E illustrate example methods of forming a self-selecting memory structure that includes horizontal bit lines in accordance with examples of the present disclosure. In FIG. 8A, processing step 800-*a* is depicted. In processing step 800-*a*, a stack may be formed that includes a first dielectric material 805, which may be an example of first dielectric material 220 as described with reference to FIG. 2A; a second dielectric material 820, which may be an example of second dielectric material 230 as described with reference to FIG. 2A; and a third dielectric material (e.g., third dielectric material 810-*a*, third dielectric material 810-*b*), which may be an example of third dielectric material (e.g., third dielectric material 235-*a*, third dielectric material 235-*b*) as described with reference to FIG. 2A. In some examples, the stack may also include a fourth dielectric material 815, which may be an example of fourth dielectric material 240 as described with reference to FIG. 2A. In some examples, a plurality of plugs (e.g., plugs 550 as described with reference to FIG. 5) may be formed on least one side of the stack.

Figure 8B:
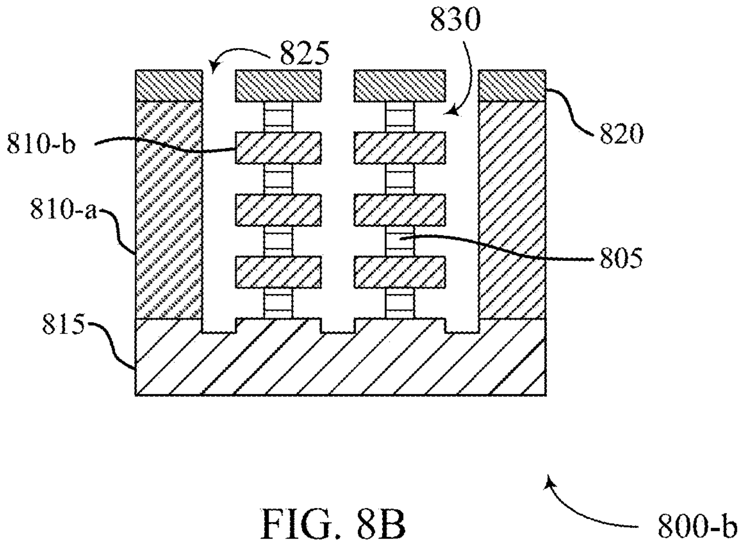

In FIG. 8B, processing step 800-*b* is depicted. In processing step 800-*b* a removal of material in a first direction may occur. The removal of material may result in a plurality of lines (e.g., trenches) 825 that extend in a first direction (e.g., a "Y" direction) and a second direction (e.g., a "Z" direction) and may extend through the first dielectric material 805, the second dielectric material 820, and at least a portion of the third dielectric material 810-*a*. In some examples, the plurality of lines 825 may also extend through the fourth dielectric material 815. In some examples, the plurality of lines 825 may be formed by an isotropic etching technique. As described above, dielectric material 805 may be a different material than, for example, second dielectric material 820 or third dielectric material (e.g., third dielectric material 810-*a*, third dielectric material 810-*b*) to facilitate the creation of uniform lines 825. After removing material in the first direction, a removal of material in a second direction may occur. The removal of material may result in a plurality of lines 830 that extend in a second direction (e.g., a "Z" that goes in and out of the depicted page) and may extend through at least a portion of the first dielectric material 805. This removal of material may serve as a placeholder for one or more first access lines (e.g., first access line 205 as described with reference to FIG. 2A) to be formed. In some examples, processing step 800-*b* may result in the third dielectric material having multiple portions. For example, a third dielectric material may include a first portion (e.g., third dielectric material 810-*a* in contact with second dielectric material 820 and fourth dielectric material 815) and a second portion (e.g., third dielectric material 810-*b* in contact with first dielectric material 805). In some examples, the third dielectric material 810-*a* and third dielectric material 810-*b* may be formed at different times. For example, third dielectric material 810-*b* may be formed before third dielectric material 810-*a*. In other examples, third dielectric material 810-*b* may be formed after third dielectric material 810-*a*. In some examples, the plurality of lines 830 may be formed by a selective isotropic etching technique.

Figure 8C:
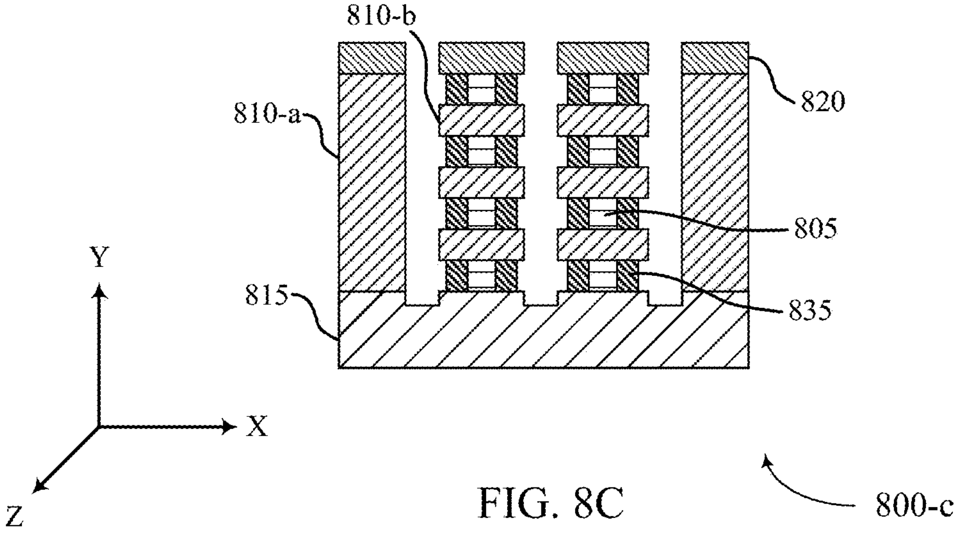

In FIG. 8C, processing step 800-*c* is depicted. In processing step 800-*c* a plurality of first access lines 835 may be formed. In some examples, first access lines 835 may be formed by depositing a conductive material, followed by isotropically etching lines 825. Processing step 800-*c* may be an example of forming a plurality of first access lines 835 in contact with the first dielectric material 805. In some examples, the first access lines 835 may be examples of first access line 205 as described with reference to FIG. 2A, and may be in contact with the first dielectric material 805. Additionally or alternatively, each of the first access lines may be in contact with one of the plurality of lines 825 (e.g., created during processing step 700-*b*). The first access lines 835 may be formed from a conductive material.

Figure 8D:
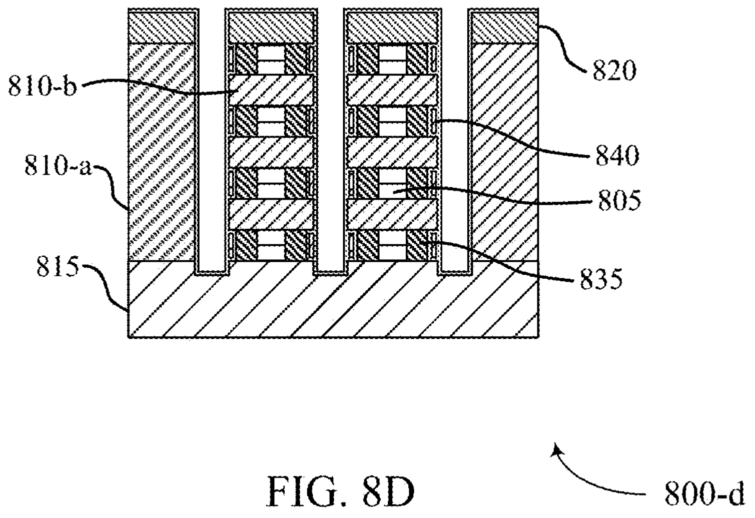

In FIG. 8D, processing step 800-*d* is depicted. In processing step 800-*d*, a plurality of discrete self-selecting material segments 840 may be first deposited. In some examples, self-selecting memory segments 840 may be an example of self-selecting memory segments 315 as described with reference to FIG. 3. In some examples, this may be an example of forming a plurality of discrete self-selecting memory segments 840 coupled with the plurality of first access lines 835.

Figure 8E:
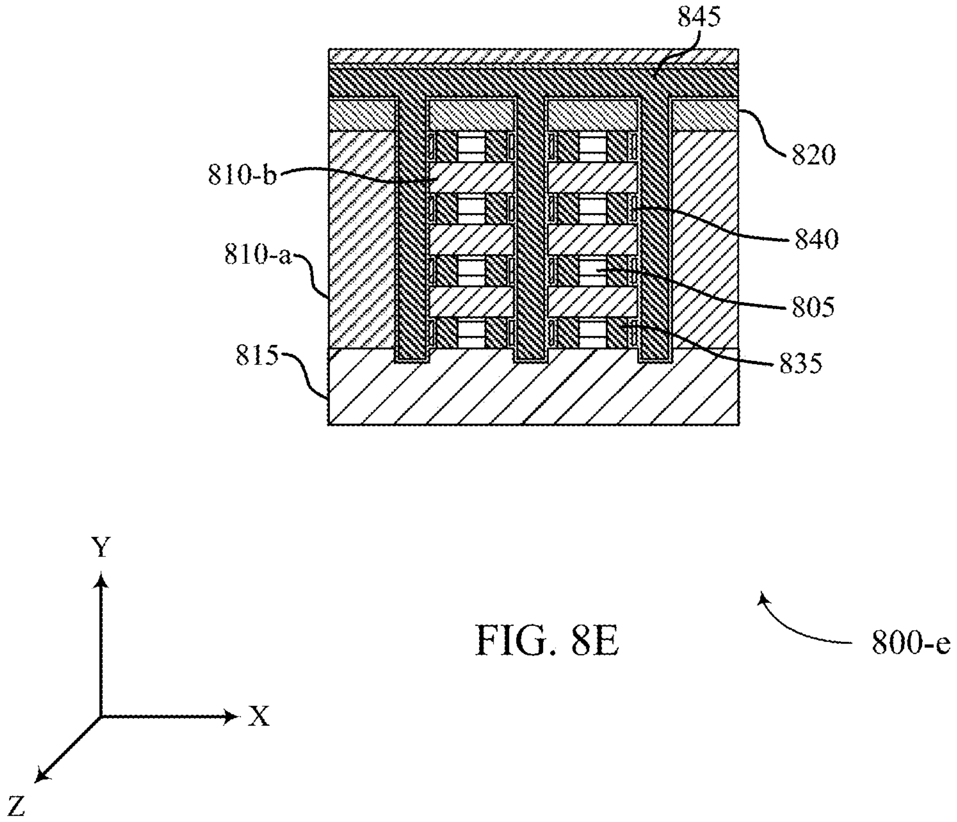

In FIG. 8E, processing step 800-*e* is depicted. Processing step 800-*e* may depict forming a plurality of second access lines 845 that are coupled with each of the plurality of discrete self-selecting memory segments 840. In some examples, each of the plurality of discrete self-selecting memory segments 840 may be positioned between a first side of a first access line of the plurality of second access lines 845 and a second side of a second access line of the plurality of second access lines 845. Additionally or alternatively, for example, one or more portions of the second access lines 845 may be etched to create one or more isolation regions (e.g., isolation region 545 as described with reference to FIG. 5), and one or more pluralities of plugs (e.g., plugs 550 as described with reference to FIG. 5) may be formed in contact with a first end of the second access line 845. In some examples, the isolation regions may isolate a conductive material (e.g., second access lines 845) in at least one direction (e.g., an "X" direction).

Figure 9:
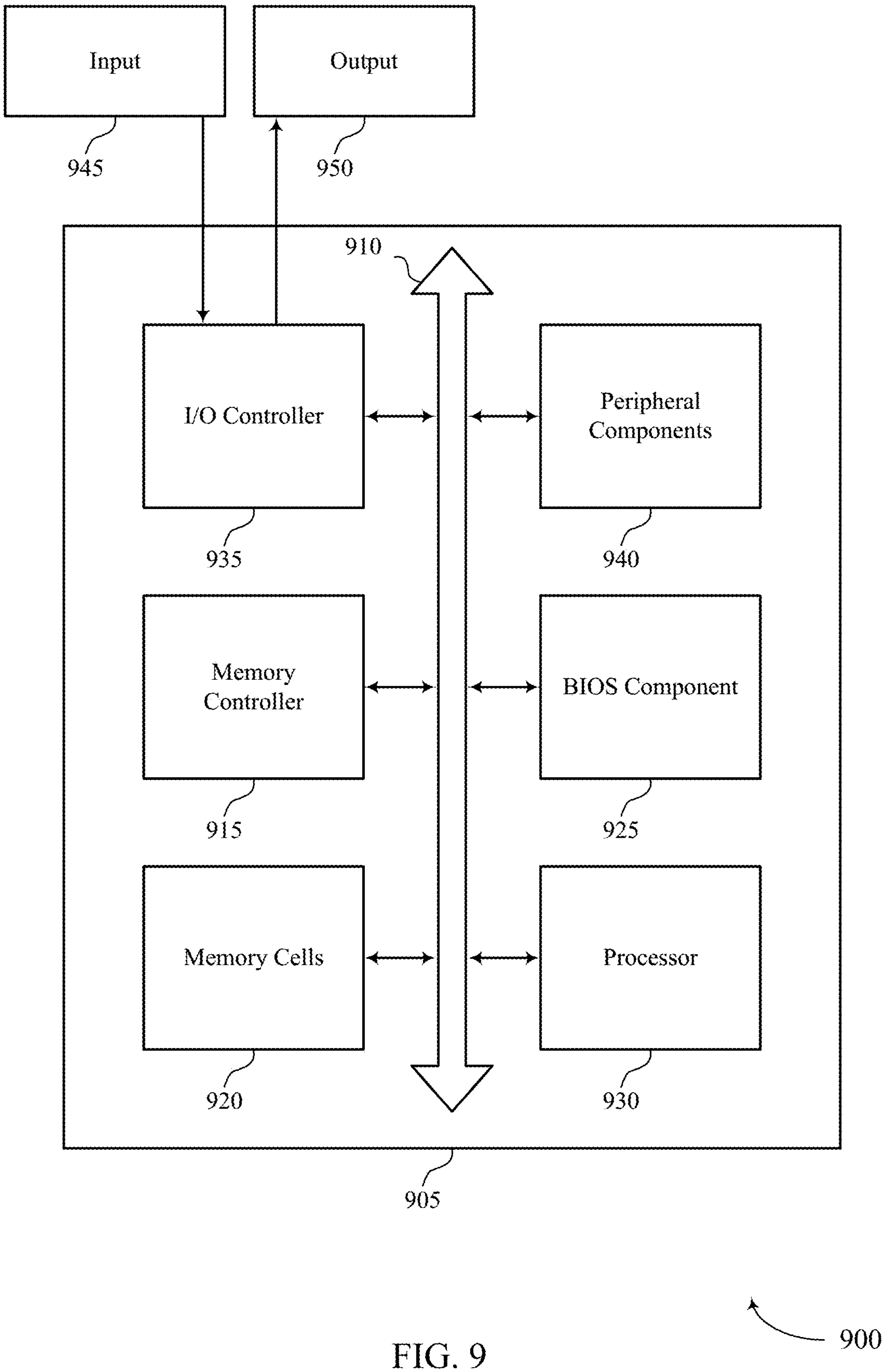
FIG. 9 illustrates a block diagram of a system including a memory array that supports self-selecting memory array with horizontal access lines in accordance with examples of the present disclosure.

FIG. 9 shows a diagram of a system 900 including a device 905 that supports self-selecting memory array with horizontal bit lines in accordance with examples of the present disclosure. Device 905 may be an example of or include the components of memory structure 200 as described above, e.g., with reference to FIG. 2. Device 905 may include components for bi-directional voice and data communications including components for transmitting and receiving communications, including memory controller 915, memory cells 920, basic input/output system (BIOS) component 925, processor 930, I/O controller 935, and peripheral components 940. These components may be in electronic communication via one or more buses (e.g., bus 910).

Memory controller 915 may operate one or more memory cells as described herein. Specifically, memory controller 915 may be configured to support self-selecting memory array with horizontal bit lines. In some cases, memory controller 915 may include a row decoder, column decoder, or both, as described herein (not shown).

Memory cells 920 may store information (i.e., in the form of a logical state) as described herein.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting self-selecting memory array with horizontal bit lines).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935.

The components of device 905 may include circuitry designed to carry out their functions. This may include various circuit elements, for example, conductive lines, transistors, capacitors, inductors, resistors, amplifiers, or other active or unselected elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device.

Figure 10:
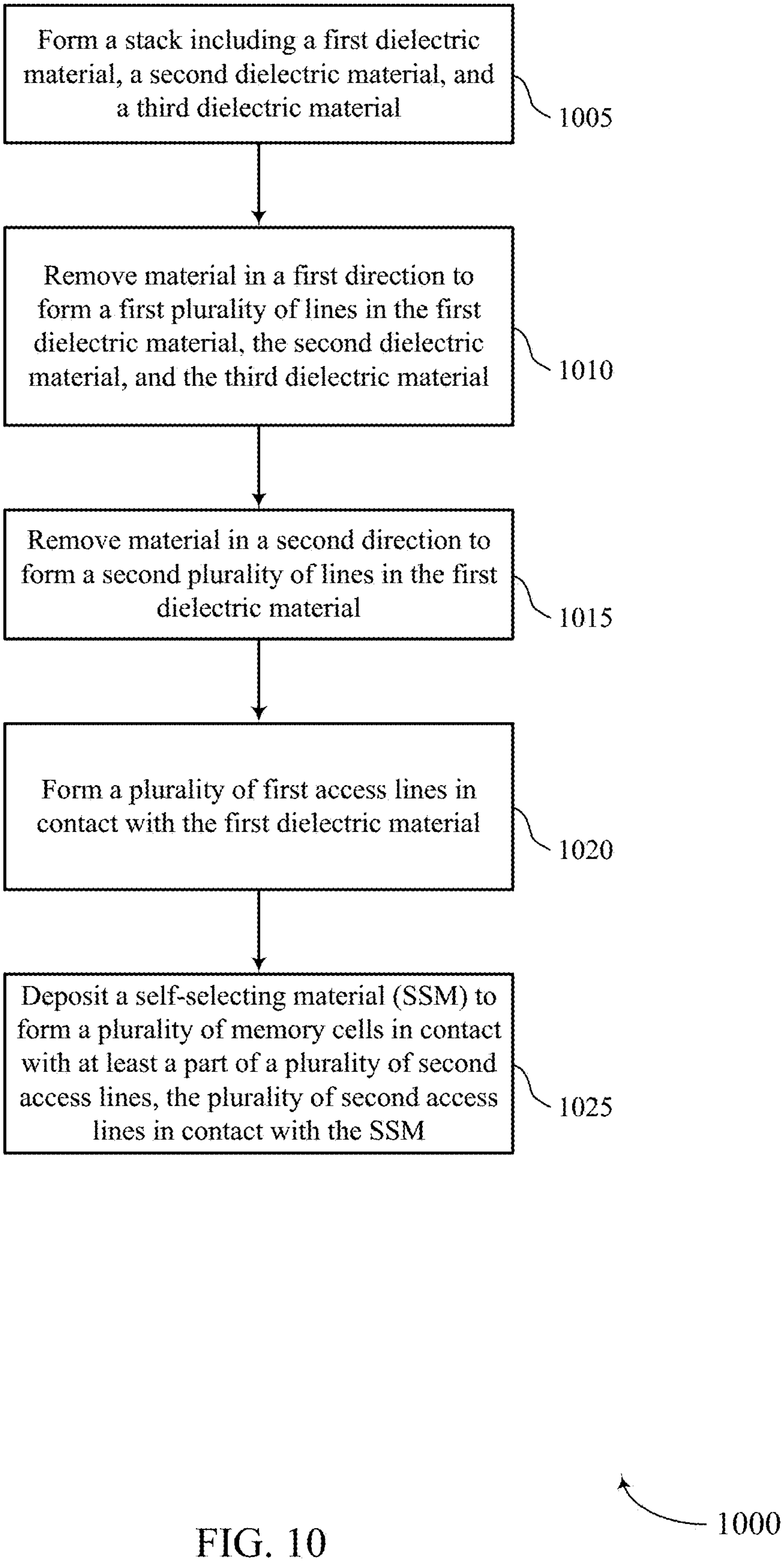
FIGS. 10 through 13 illustrate methods of forming self-selecting memory array with horizontal access lines in accordance with examples of the present disclosure.

FIG. 10 shows a flowchart illustrating a method 1000 of forming a self-selecting memory array with horizontal bit lines in accordance with examples of the present disclosure. The operations of method 1000 may be implemented by the method described herein, for example with reference to FIGS. 7A through 7E and 8A through 8E.

At 1005 a stack may be formed that includes a first dielectric material, a second dielectric material, and a third dielectric material. The operations of 1005 may be performed according to the methods described herein. In certain examples, aspects of the operations of 1005 may be performed by one or more processes described with reference to FIGS. 7A through 7E and 8A through 8E.

At 1010 a removal of material in a first direction may occur, to form a first plurality of lines in the first dielectric material, the second dielectric material, and the third dielectric material. The operations of 1010 may be performed according to the methods described herein and may be conducted, for example, using an isotropic etching technique. In certain examples, aspects of the operations of 1010 may be performed by one or more processes described with reference to FIGS. 7A through 7E and 8A through 8E.

At 1015 a removal of material in a second direction may occur, to form a second plurality of lines in the first dielectric material. The operations of 1015 may be performed according to the methods described herein. In certain examples, aspects of the operations of 1015 may be performed by one or more processes described with reference to FIGS. 7A through 7E and 8A through 8E.

At 1020 a plurality of first access lines may be formed that in contact with the first dielectric material. The operations of 1020 may be performed according to the methods described herein. In certain examples, aspects of the operations of 1020 may be performed by one or more processes described with reference to FIGS. 7A through 7E and 8A through 8E.

At 1025 a deposition of a self-selecting material may occur, to form a plurality of memory cells in contact with at least a part of a plurality of second access lines, the plurality of second access lines in contact with the self-selecting memory. The plurality of second access lines may be formed, for example, by filling one or more lines (e.g., trenches) with a conductive material. The conductive material may then be patterned into electrically isolated lines along at least one direction (e.g., a "Z" direction). During such a patterning operation, conductive material may be selectively removed and replaced with a dielectric material. The operations of 1025 may be performed according to the methods described herein. In certain examples, aspects of the operations of 1025 may be performed by one or more processes described with reference to FIGS. 7A through 7E and 8A through 8E.

Figure 11:
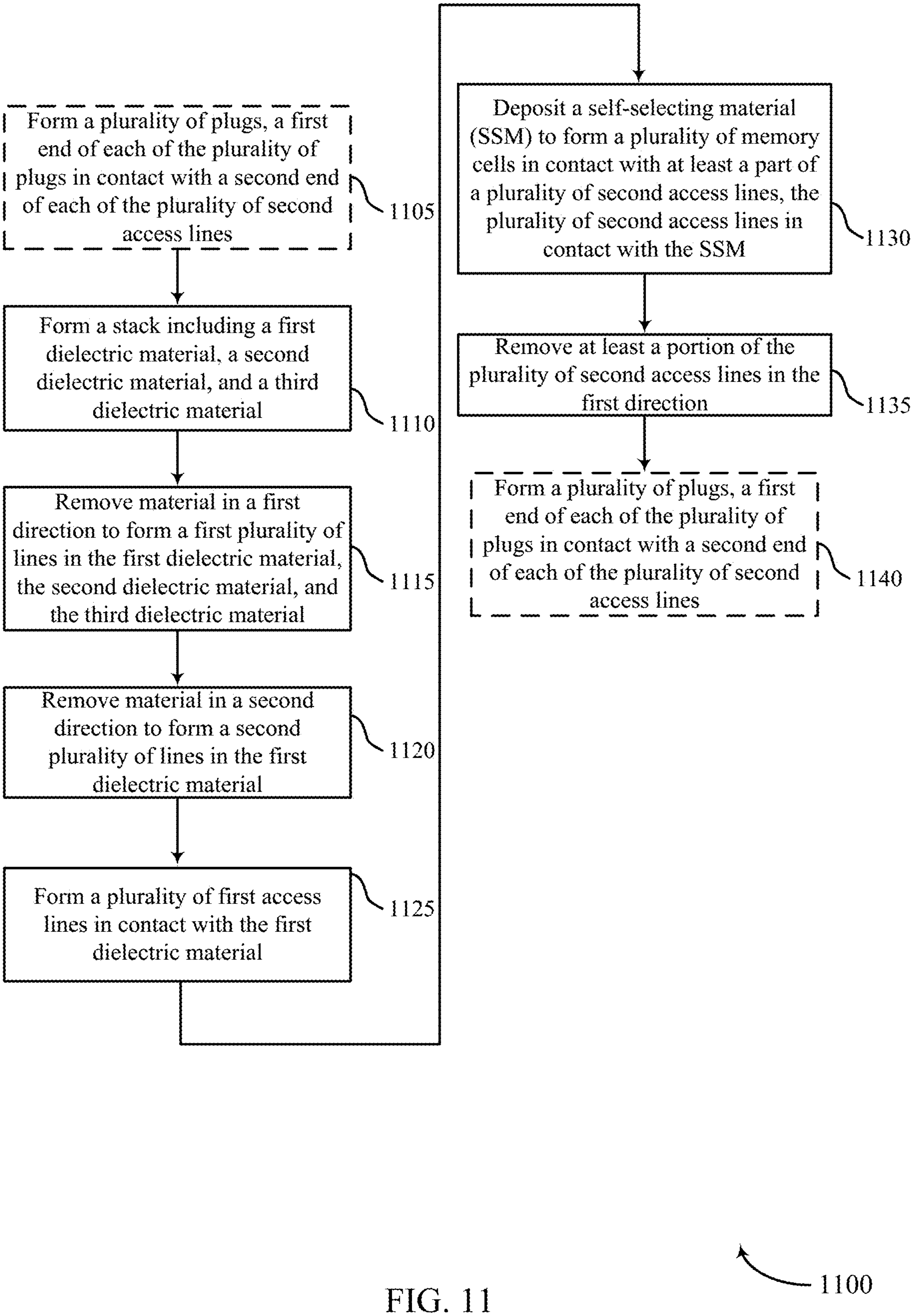

FIG. 11 shows a flowchart illustrating a method 1100 of forming a self-selecting memory array with horizontal bit lines in accordance with examples of the present disclosure. The operations of method 1100 may be implemented by the methods described herein, for example with reference to FIGS. 7A through 7E and 8A through 8E.

At 1105 a plurality of plugs may be formed. The plurality of plugs may be formed before forming a stack that includes a first dielectric material, a second dielectric material, and a third dielectric material (e.g., 1110). In some examples, a first end of each of the plurality of plugs may be in contact with a second end of each of the plurality of second access lines. The operations of 1105 may be performed according to the methods described herein. In certain examples, aspects of the operations of 1105 may be performed by one or more processes described with reference to FIGS. 7A through 7E and 8A through 8E.

At 1110 a stack may be formed that includes a first dielectric material, a second dielectric material, and a third dielectric material. The operations of 1110 may be performed according to the methods described herein. In certain examples, aspects of the operations of 1105 may be performed by one or more processes described with reference to FIGS. 7A through 7E and 8A through 8E.

At 1115 a removal of material in a first direction may occur, to form a first plurality of lines in the first dielectric material, the second dielectric material, and the third dielectric material. The operations of 1115 may be performed according to the methods described herein. In certain examples, aspects of the operations of 1115 may be performed by one or more processes described with reference to FIGS. 7A through 7E and 8A through 8E.

At 1120 a removal of material in a second direction may occur, to form a second plurality of lines in the first dielectric material. The operations of 1120 may be performed according to the methods described herein. In certain examples, aspects of the operations of 1120 may be performed by one or more processes described with reference to FIGS. 7A through 7E and 8A through 8E.

At 1125 a plurality of first access lines may be formed that are in contact with the first dielectric material. The operations of 1125 may be performed according to the methods described herein. In certain examples, aspects of the operations of 1125 may be performed by one or more processes described with reference to FIGS. 7A through 7E and 8A through 8E.

At 1130 a self-selecting material may be deposited to form a plurality of memory cells in contact with at least a part of a plurality of second access lines, the plurality of second access lines in contact with the self-selecting memory. The operations of 1130 may be performed according to the methods described herein. In certain examples, aspects of the operations of 1130 may be performed by one or more processes described with reference to FIGS. 7A through 7E and 8A through 8E.

At 1135 a removal of at least a portion of the plurality of second access lines in the first direction may occur. The operations of 1135 may be performed according to the methods described herein. In certain examples, aspects of the operations of 1135 may be performed by one or more processes described with reference to FIGS. 7A through 7E and 8A through 8E.

At 1140 a plurality of plugs may be formed. In some examples, a first end of each of the plurality of plugs may be in contact with a second end of each of the plurality of second access lines. The operations of 1140 may be performed according to the methods described herein. In certain examples, aspects of the operations of 1140 may be performed by one or more processes described with reference to FIGS. 7A through 7E and 8A through 8E.

In some examples, the method of formation may also include forming a stack that includes a first dielectric material, a second dielectric material, and a third dielectric material. In some cases, the method of formation may include removing material in a second direction to form a second plurality of lines in the first dielectric material. The method of formation may include forming a plurality of first access lines in contact with the first dielectric material.

In some examples, the method of formation may include depositing a self-selecting material to form a plurality of memory cells in contact with at least a part of a plurality of second access lines, the plurality of second access lines in contact with the self-selecting memory. In some examples, the self-selecting memory may include chalcogenide. In other examples, the method of formation may include removing material in a first direction to form a first plurality of lines in the first dielectric material, the second dielectric material, and the third dielectric material. The method of formation may also include removing at least a portion of the plurality of second access lines in the first direction.

Additionally or alternatively, for example, the method of formation may include forming a second plurality of plugs in the stack, a first end of each of the second plurality of plugs in contact with a first end of each of the plurality of second access lines. At least one of the first plurality of lines may include a width that is greater than another line of the first plurality of lines. In other cases, the first dielectric material and the second dielectric material may be a same material. In some examples, the method of formation may also include forming a plurality of plugs in the stack, a first end of each of the plurality of plugs in contact with a second end of each of the plurality of second access lines. In other examples, the plurality of second access lines may be formed, for example, by filling one or more lines (e.g., trenches) with a conductive material. The conductive material may then be patterned into electrically isolated lines along at least one direction (e.g., a "Z" direction). During such a patterning operation, conductive material may be selectively removed and replaced with a dielectric material.

Figure 12:
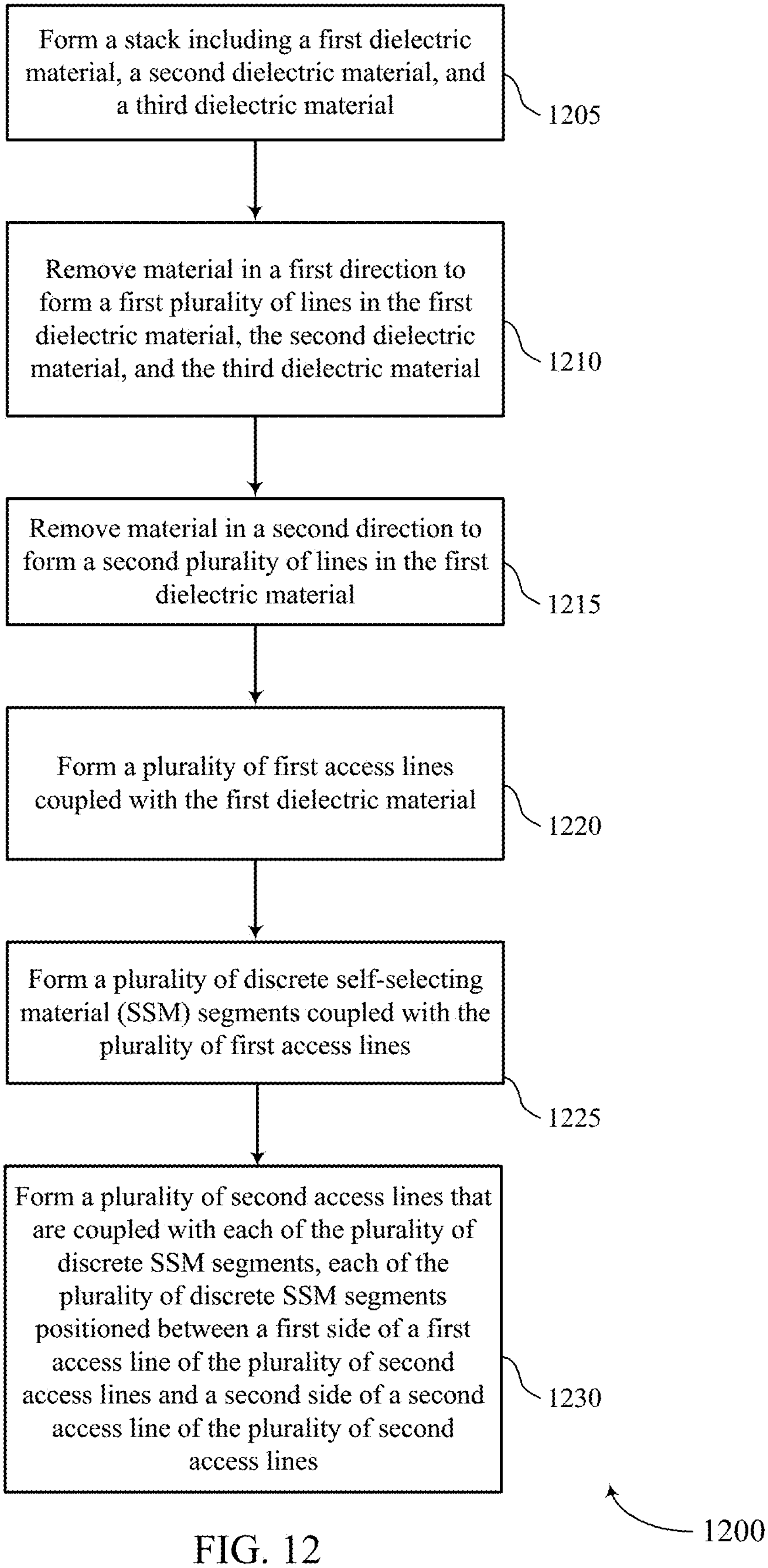

FIG. 12 shows a flowchart illustrating a method 1200 of forming a self-selecting memory array with horizontal bit lines in accordance with examples of the present disclosure. The operations of method 1200 may be implemented by the method described herein, for example with reference to FIGS. 7A through 7E and 8A through 8E.

At 1205 a stack may be formed that includes a first dielectric material, a second dielectric material, and a third dielectric material. The operations of 1205 may be performed according to the methods described herein. In certain examples, aspects of the operations of 1205 may be performed by one or more processes described with reference to FIGS. 7A through 7E and 8A through 8E.

At 1210 a removal of material in a first direction may occur, to form a first plurality of lines in the first dielectric material, the second dielectric material, and the third dielectric material. The operations of 1210 may be performed according to the methods described herein. In certain examples, aspects of the operations of 1210 may be performed by one or more processes described with reference to FIGS. 7A through 7E and 8A through 8E.

At 1215 a removal of material in a second direction may occur, to form a second plurality of lines in the first dielectric material. The operations of 1215 may be performed according to the methods described herein. In certain examples, aspects of the operations of 1215 may be performed by one or more processes described with reference to FIGS. 7A through 7E and 8A through 8E.

At 1220 a plurality of first access lines may be formed that are coupled with the first dielectric material. The operations of 1220 may be performed according to the methods described herein. In certain examples, aspects of the operations of 1220 may be performed by one or more processes described with reference to FIGS. 7A through 7E and 8A through 8E.

At 1225 a plurality of discrete self-selecting material segments may be formed that are coupled with the plurality of first access lines. The operations of 1225 may be performed according to the methods described herein. In certain examples, aspects of the operations of 1225 may be performed by one or more processes described with reference to FIGS. 7A through 7E and 8A through 8E.

At 1230 a plurality of second access lines may be formed that are coupled with each of the plurality of discrete self-selecting memory segments, each of the plurality of discrete self-selecting memory segments positioned between a first side of a first access line of the plurality of second access lines and a second side of a second access line of the plurality of second access lines. The plurality of second access lines may be formed, for example, by filling one or more lines (e.g., trenches) with a conductive material. The conductive material may then be patterned into electrically isolated lines along at least one direction (e.g., a "Z" direction). During such a patterning operation, conductive material may be selectively removed and replaced with a dielectric material. The operations of 1230 may be performed according to the methods described herein. In certain examples, aspects of the operations of 1230 may be performed by one or more processes described with reference to FIGS. 7A through 7E and 8A through 8E.

Figure 13:
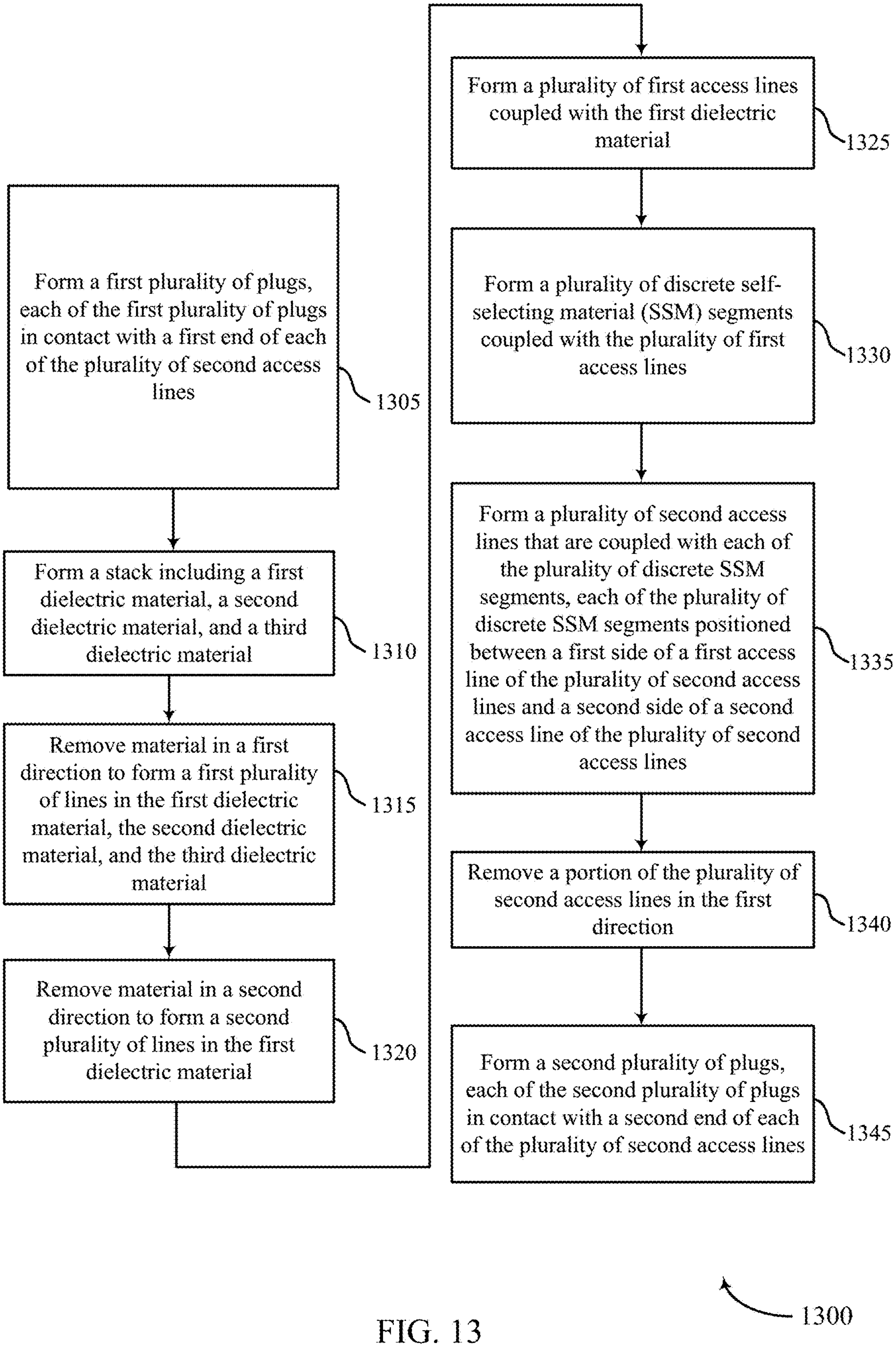

FIG. 13 shows a flowchart illustrating a method 1300 of forming a self-selecting memory array with horizontal bit lines in accordance with examples of the present disclosure. The operations of method 1300 may be implemented by the method described herein, for example with reference to FIGS. 7A through 7E and 8A through 8E.

At 1305 a first plurality of plugs may be formed. In some examples, each of the first plurality of plugs may be in contact with a first end of each of the plurality of second access lines The operations of 1305 may be performed according to the methods described herein. In certain examples, aspects of the operations of 1310 may be performed by one or more processes described with reference to FIGS. 7A through 7E and 8A through 8E.

At 1310 a stack may be formed that includes a first dielectric material, a second dielectric material, and a third dielectric material. The operations of 1310 may be performed according to the methods described herein. In certain examples, aspects of the operations of 1305 may be performed by one or more processes described with reference to FIGS. 7A through 7E and 8A through 8E.

At 1315 a removal of material in a first direction may occur, to form a first plurality of lines in the first dielectric material, the second dielectric material, and the third dielectric material. The operations of 1315 may be performed according to the methods described herein. In certain examples, aspects of the operations of 1315 may be performed by one or more processes described with reference to FIGS. 7A through 7E and 8A through 8E.

At 1320 a removal of material in a second direction may occur, to form a second plurality of lines in the first dielectric material. The operations of 1320 may be performed according to the methods described herein. In certain examples, aspects of the operations of 1320 may be performed by one or more processes described with reference to FIGS. 7A through 7E and 8A through 8E.

At 1325 a plurality of first access lines may be forming that are coupled with the first dielectric material. The operations of 1325 may be performed according to the methods described herein. In certain examples, aspects of the operations of 1325 may be performed by one or more processes described with reference to FIGS. 7A through 7E and 8A through 8E.

At 1330 a plurality of discrete self-selecting material segments may be formed that are coupled with the plurality of first access lines. The operations of 1330 may be performed according to the methods described herein. In certain examples, aspects of the operations of 1330 may be performed by one or more processes described with reference to FIGS. 7A through 7E and 8A through 8E.

At 1335 a plurality of second access lines may be formed that are coupled with each of the plurality of discrete self-selecting memory segments. In some examples, each of the plurality of discrete self-selecting memory segments may be positioned between a first side of a first access line of the plurality of second access lines and a second side of a second access line of the plurality of second access lines. The operations of 1335 may be performed according to the methods described herein. In certain examples, aspects of the operations of 1335 may be performed by one or more processes described with reference to FIGS. 7A through 7E and 8A through 8E.

At 1340 a portion of the plurality of second access lines may be removed in the first direction. The operations of 1340 may be performed according to the methods described herein. In certain examples, aspects of the operations of 1340 may be performed by one or more processes described with reference to FIGS. 7A through 7E and 8A through 8E.

At 1345 a second plurality of plugs may be formed. In some examples, each of the second plurality of plugs may be in contact with a second end of each of the plurality of second access lines. The operations of 1345 may be performed according to the methods described herein. In certain examples, aspects of the operations of 1345 may be performed by one or more processes described with reference to FIGS. 7A through 7E and 8A through 8E.

In some examples, the method of formation may include forming a stack that includes a first dielectric material, a second dielectric material, and a third dielectric material. In some cases, at least some of the plurality of discrete self-selecting memory segments may include chalcogenide. In other examples, the method of formation may include removing material in a second direction to form a second plurality of lines in the first dielectric material. The method of formation may also include forming a plurality of first access lines coupled with the first dielectric material.

In some cases, the method of formation may include forming a plurality of second access lines that are coupled with each of the plurality of discrete self-selecting memory segments, each of the plurality of discrete self-selecting memory segments positioned between a first side of a first access line of the plurality of second access lines and a second side of a second access line of the plurality of second access lines. Additionally or alternatively, for example, the method of formation may include removing material in a first direction to form a first plurality of lines in the first dielectric material, the second dielectric material, and the third dielectric material.

In other cases, the method of formation may include removing material in a second direction to form a second plurality of lines in the first dielectric material. In some examples, each of the first dielectric material, the second dielectric material, and the third dielectric material comprise a different material. In other examples, a width of the first dielectric material, after removing the material in the second direction, is greater than a width of at least one of the plurality of second access lines. Additionally or alternatively, the method of formation may include forming a first plurality of plugs and a second plurality of plugs in the stack, each of the first plurality of plugs in contact with a first end of each of the plurality of second access lines, and each of the second plurality of plugs in contact with a second end of each of the plurality of second access lines.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three-terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:

a plurality of first access lines extending in a first direction;

a plurality of second access lines extending in a second direction;

a first plurality of memory cells in contact with a first access line of the plurality of second access lines;

a second plurality of memory cells in contact with a second access line of the plurality of second access lines;

a dielectric material physically between the first plurality of memory cells and the second plurality of memory cells;

a first plug in contact with a first portion of the first access line; and a second plug in contact with a second portion of the first access line.

2. The memory device of claim 1, further comprising:

a third plug in contact with a first portion of the second access line.

3. The memory device of claim 2, further comprising:

a fourth plug in contact with a second portion of the second access line.

4. The memory device of claim 1, wherein the first access line is isolated from the second access line.

5. The memory device of claim 1, further comprising:

a second dielectric material positioned above at least a portion of a first memory cell of the first plurality of memory cells and a first memory cell of the second plurality of memory cells, wherein the second dielectric material is different than the dielectric material.

6. The memory device of claim 1, wherein the first plurality of memory cells and the second plurality of memory cells are located between the first access line and the second access line.

7. The memory device of claim 1, wherein each of the first plurality of memory cells and each of the second plurality of memory cells comprises a discrete self-selecting memory cell.

8. The memory device of claim 1, further comprising:

a third plurality of memory cells in contact with a third access line of the plurality of first access lines, wherein at least a portion of the third plurality of memory cells are located at an intersection of the first access line and the third access line.

9. The memory device of claim 1, wherein:

at least a portion of the dielectric material extends in a first plane parallel to the plurality of first access lines;

the first plurality of memory cells borders the first access line of the plurality of second access lines; and the second plurality of memory cells borders the second access line of the plurality of second access lines.

10. A memory device, comprising:

a plurality of first access lines extending in a first direction;

a plurality of second access lines extending in a second direction;

a first plurality of memory cells in contact with a first access line of the plurality of second access lines;

a second plurality of memory cells in contact with a second access line of the plurality of second access lines or a third access line of the plurality of second access lines;

a dielectric material physically between the first plurality of memory cells and the second plurality of memory cells;

a first plug in contact with a first portion of the second access line; and a second plug in contact with a first portion of the third access line.

11. The memory device of claim 10, further comprising:

a third plug in contact with a second portion of the second access line; and a fourth plug in contact with a second portion of the third access line.

12. The memory device of claim 11, further comprising:

a fifth plug in contact with a first portion of the first access line; and a sixth plug in contact with a second portion of the first access line.

13. The memory device of claim 10, wherein the first access line is isolated from the second access line.

14. The memory device of claim 10, further comprising:

a second dielectric material positioned above at least a portion of a first memory cell of the first plurality of memory cells and a first memory cell of the second plurality of memory cells, wherein the second dielectric material is different than the dielectric material.

15. The memory device of claim 10, wherein the first plurality of memory cells and the second plurality of memory cells are located between the first access line and the second access line.

16. The memory device of claim 10, wherein each of the first plurality of memory cells and each of the second plurality of memory cells comprises a discrete self-selecting memory cell.

17. The memory device of claim 10, further comprising:

a third plurality of memory cells in contact with a second access line of the plurality of first access lines, wherein at least a portion of the third plurality of memory cells are located at an intersection of the first access line and the second access line.

18. The memory device of claim 10, wherein:

at least a portion of the dielectric material extends in a first plane parallel to the plurality of first access lines;

the first plurality of memory cells borders the first access line of the plurality of second access lines; and the second plurality of memory cells borders the second access line of the plurality of second access lines.

19. A method of forming a memory device, comprising:

forming a stack comprising a first dielectric material, a second dielectric material, and a third dielectric material;

removing material from the stack to form a first plurality of lines extending in a first direction in the first dielectric material, the second dielectric material, and the third dielectric material;

removing material from the stack to form a second plurality of lines extending in a second direction in the first dielectric material;

forming a plurality of first access lines extending in the first direction;

forming a plurality of second access lines extending in the second direction;

depositing a material to form a plurality of memory cells, wherein the first dielectric material is physically between a first subset of the plurality of memory cells and a second subset of the plurality of memory cells;

forming a first plurality of plugs, wherein each plug of the first plurality of plugs is adjacent to a respective first portion of the plurality of second access lines; and forming a second plurality of plugs, wherein each plug of the second plurality of plugs is adjacent to a respective second portion of the plurality of second access lines.

20. The method of claim 19, further comprising:

forming a third plurality of plugs, wherein each plug of the third plurality of plugs is in contact with a first portion of a respective access line of the plurality of second access lines; and forming a fourth plurality of plugs, wherein each of the fourth plurality of plugs is in contact with a second portion of a respective access line of the plurality of second access lines.

* * * * *